United States Patent
Sakamoto et al.

(10) Patent No.: US 9,466,548 B2
(45) Date of Patent: Oct. 11, 2016

(54) SEMICONDUCTOR DEVICE AND METHOD OF MANUFACTURING SEMICONDUCTOR DEVICE

(75) Inventors: Ken Sakamoto, Tokyo (JP); Taketoshi Shikano, Tokyo (JP); Taishi Sasaki, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/358,917

(22) PCT Filed: Feb. 22, 2012

(86) PCT No.: PCT/JP2012/054293
§ 371 (c)(1),
(2), (4) Date: May 16, 2014

(87) PCT Pub. No.: WO2013/124988
PCT Pub. Date: Aug. 29, 2013

(65) Prior Publication Data
US 2014/0353814 A1 Dec. 4, 2014

(51) Int. Cl.
*H01L 23/367* (2006.01)
*H01L 21/56* (2006.01)
(Continued)

(52) U.S. Cl.
CPC ............ *H01L 23/367* (2013.01); *H01L 21/56* (2013.01); *H01L 21/565* (2013.01); *H01L 23/13* (2013.01);
(Continued)

(58) Field of Classification Search
CPC ............ H01L 2924/01079; H01L 2924/1079
USPC .......................................... 257/712; 438/122
See application file for complete search history.

(56) References Cited

U.S. PATENT DOCUMENTS

| 8,247,891 B2 * | 8/2012 | Wen et al. ................. 257/675 |
| 2004/0089928 A1 | 5/2004 | Nakajima et al. |
| 2008/0291636 A1 | 11/2008 | Mori et al. |

FOREIGN PATENT DOCUMENTS

| CN | 1499619 A | 5/2004 |
| CN | 101312183 A | 11/2008 |

(Continued)

OTHER PUBLICATIONS

Notification of Transmittal of Translation of the International Preliminary Report on Patentability and Translation of Written Opinion of the International Searching Authority; PCT/JP2012/054293; issued on Sep. 4, 2014.

(Continued)

*Primary Examiner* — Neil Prasad
(74) *Attorney, Agent, or Firm* — Studebaker & Brackett PC

(57) ABSTRACT

A semiconductor device incorporating a heat spreader and improved to inhibit dielectric breakdown is provided. The semiconductor device has an electrically conductive heat spreader having a bottom surface, a sheet member having a front surface and a back surface electrically insulated from each other, IGBTs and diodes fixed on the heat spreader and electrically connected thereto, and a molding resin. The front surface contacts with the bottom surface and has a peripheral portion jutting out from edges thereof. The molding resin encapsulates the front surface of the sheet member, the heat spreader and the semiconductor elements. At least part of the back surface of the sheet member is exposed out of the molding resin. The heat spreader has, at a corner of its bottom surface, corner portions having a beveled shape or a curved-surface shape as seen in plan and having a rectangular shape as seen in section.

20 Claims, 28 Drawing Sheets

(51) Int. Cl.
  *H01L 23/31* (2006.01)
  *H01L 23/00* (2006.01)
  *H01L 23/433* (2006.01)
  *H01L 23/495* (2006.01)
  *H01L 23/498* (2006.01)
  *H01L 23/13* (2006.01)
  *H01L 23/36* (2006.01)
  *H01L 23/373* (2006.01)

(52) U.S. Cl.
  CPC ....... *H01L 23/3107* (2013.01); *H01L 23/3142* (2013.01); *H01L 23/3157* (2013.01); *H01L 23/36* (2013.01); *H01L 23/4334* (2013.01); *H01L 23/49503* (2013.01); *H01L 23/49568* (2013.01); *H01L 23/49844* (2013.01); *H01L 23/564* (2013.01); *H01L 23/3735* (2013.01); *H01L 23/49562* (2013.01); *H01L 2224/32245* (2013.01); *H01L 2224/48091* (2013.01); *H01L 2224/48137* (2013.01); *H01L 2224/48139* (2013.01); *H01L 2224/48247* (2013.01); *H01L 2224/48472* (2013.01); *H01L 2224/49175* (2013.01); *H01L 2224/73265* (2013.01); *H01L 2924/1305* (2013.01); *H01L 2924/13055* (2013.01); *H01L 2924/13091* (2013.01); *H01L 2924/181* (2013.01)

(56) References Cited

FOREIGN PATENT DOCUMENTS

| | | |
|---|---|---|
| EP | 0962974 A2 | 12/1999 |
| JP | H03-057249 A | 3/1991 |
| JP | H05-299528 A | 11/1993 |
| JP | H06-302722 A | 10/1994 |
| JP | H06-334069 A | 12/1994 |
| JP | H08-008373 A | 1/1996 |
| JP | H08-78578 A | 3/1996 |
| JP | H10-261744 A | 9/1998 |
| JP | H11-087567 A | 3/1999 |
| JP | H11-340374 A | 12/1999 |
| JP | 2000-340719 A | 12/2000 |
| JP | 2003-124406 A | 4/2003 |
| JP | 2004-165281 A | 6/2004 |
| JP | 2005-210006 A | 8/2005 |
| JP | 2006-086342 A | 3/2006 |
| JP | 2006-179538 A | 7/2006 |
| JP | 2007-150040 A | 6/2007 |
| JP | 2008-028006 A | 2/2008 |
| JP | 2008-258435 A | 10/2008 |
| JP | 2008-294284 A | 12/2008 |
| JP | 2009-194327 A | 8/2009 |
| JP | 2010-267794 A | 11/2010 |
| JP | 2011-009410 A | 1/2011 |
| KR | 20-0171663 Y1 | 3/2000 |
| KR | 2011-0075231 A | 7/2011 |

OTHER PUBLICATIONS

International Search Report; PCT/JP2012/054293; May 22, 2012.
An Office Action issued by the Korean Patent Office on Jun. 12, 2015, which corresponds to Korean Patent Application No. 10-2014-7021760 and is related to U.S. Appl. No. 14/358,917; with English language partial translation.
An Office Action; "Notice of Reasons for Rejection," issued by the Japanese Patent Office on Jul. 7, 2015, which corresponds to Japanese Patent Application No. 2014-500798 and is related to U.S. Appl. No. 14/358,917; with English language partial translation.
An Office Action issued by the Korean Patent Office on Nov. 19, 2015, which corresponds to Korean Patent Application No. 10-2014-7021760 and is related to U.S. Appl. No. 14/358,917; with English language partial translation.
An Office Action issued by the German Patent Office on Nov. 25, 2015, which corresponds to German Patent Application No. 11 2012 005 920.4 and is related to U.S. Appl. No. 14/358,917; with English language partial translation.
An Office Action; "Notice of Reasons for Rejection," issued by the Japanese Patent Office on Jun. 14, 2016, which corresponds to Japanese Patent Application No. 2015-158260 and is related to U.S. Appl. No. 14/358,914; with English language partial translation.
The first Office Action issued by the Chinese Patent Office on Jun. 2, 2016, which corresponds to Chinese Patent Application No. 201280070502.0 and is related to U.S. Appl. No. 14/358,917; with English language partial translation.

\* cited by examiner

A-A

B-B

G-G

SEMICONDUCTOR DEVICE AND METHOD OF MANUFACTURING SEMICONDUCTOR DEVICE

TECHNICAL FIELD

The present invention relates to a semiconductor device and, more particularly, to a semiconductor device having a heat spreader and a method of manufacturing the semiconductor device.

BACKGROUND ART

A power semiconductor device having a metal block for heat dissipation (heat spreader) mounted on an insulating sheet, and a semiconductor element set on the metal block, for example, as disclosed in Patent Literature 1 shown below, is known. A power semiconductor device of this kind incorporates a power semiconductor element such as an IGBT.

In the power semiconductor device described in Patent Literature 1, the insulating sheet is made slightly larger than the metal block such as to jut out from edges of the metal block to a certain size. The insulating sheet thus provided is bent into a region on the metal block side. Further, an encapsulation resin is provided so as to cover a back surface portion of the bent insulating sheet. This construction enables securing a creeping distance so that the insulation with the insulating sheet is secured. A reduction in size of the semiconductor package can also be achieved by bending the insulating sheet.

A semiconductor device incorporating a power semiconductor element uses a large amount of power. A high insulating effect is therefore required in the package structure for the semiconductor device. A study has also been made about this point in the above-mentioned related art, and the development of techniques for securing insulation in semiconductor devices incorporating power semiconductor elements is being pursued.

CITATION LIST

Patent Literature

Patent Literature 1: Japanese Patent Laid-Open No. 2011-9410
Patent Literature 2: Japanese Patent Laid-Open No. 2010-267794
Patent Literature 3: Japanese Patent Laid-Open No. 2003-124406
Patent Literature 4: Japanese Patent Laid-Open No. 6-302722

SUMMARY OF INVENTION

Technical Problem

An object of the present invention is to provide a semiconductor device incorporating a heat spreader and improved so as to inhibit dielectric breakdown and a method of manufacturing the semiconductor device.

Solution to Problem

According to a first aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the heat spreader includes a corner portion at a corner of the bottom surface, the corner portion includes a shape of curved surface or a beveled shape as seen in the plan view, the corner portion is rectangular as seen in the section of the heat spreader.

According to a second aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the front surface of the peripheral portion includes a layer formed of an electrically insulating coating material, the layer includes at least one of higher insulation quality and higher adhesion to the front surface of the sheet member compared with a material of the encapsulation resin body.

According to a third aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein
the peripheral portion of the sheet member includes:
a plane portion extending parallel to the bottom surface; and
a bent portion provided outside the plane portion in a vicinity of a corner of the heat spreader or along a side of the heat spreader, the bent portion bending so as to rise on the front surface side;
the encapsulation resin body covers the back surface of the sheet member in the bent portion.

According to a fourth aspect of the present invention, a method of manufacturing of a semiconductor device, the method including the steps of:
preparing a heat spreader including a bottom surface and an electrically conductivity, a semiconductor element to be fixed on the heat spreader, and a sheet member including a front surface and a back surface, the front and back surfaces electrically insulated from each other;
bending the peripheral portion to the heat spreader side by bent portion forming means, after placing the sheet member, the heat spreader and the semiconductor element fixed on the heat spreader into a cavity of a mold, placing the sheet member on a cavity bottom surface of the mold so that the back surface faces the cavity bottom surface, and placing the heat spreader on the front surface of the sheet member to provide a peripheral portion that juts out from an edge of the bottom surface of the heat spreader;
performing an encapsulating process, in a state where bending on the peripheral portion is completed, so that the front surface of the sheet member, the back surface of the peripheral portion, the heat spreader, and the semiconductor element are encapsulated, and at least a portion of the back surface of the sheet member is exposed.

According to a fifth aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the peripheral portion includes a smaller-thickness portion in the back surface, the smaller-thickness portion is a portion reduced in thickness to a tip of the peripheral portion so that a step is produced, the step recesses the front surface side.

According to a sixth aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein at least one of a projecting portion or a recess provided in the front surface of the peripheral portion.

According to a seventh aspect of the present invention, a semiconductor device including:
a heat spreader including a bottom surface and an electrically conductivity;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the sheet member is formed by laying an insulating layer and a metal layer, the insulating layer provided the front surface side, the metal layer provided the back surface side compared with the insulating layer,
at least one through hole is provided in the peripheral portion, the through hole penetrates from the front surface to the back surface,
a bur projecting on the back surface side is provided on an edge portion of the through hole on the back surface side of the metal layer, and
the encapsulation resin body covers a portion in the back surface of the peripheral portion where the burr is provided.

According to an eighth aspect of the present invention, a semiconductor device including:
a heat spreader including a bottom surface and an electrically conductivity;
an insulating sheet including a front surface and a back surface, the front and back surfaces electrically insulated from each other, the front surface contacting the bottom surface of the heat spreader,
a metal sheet contacting with the back surface of the insulating sheet, including a peripheral portion that juts out from an edge of the bottom surface, the peripheral portion including an upper surface facing a region on the heat spreader side;
a semiconductor element fixed on the heat spreader and electrically connected to the heat spreader; and
an encapsulation resin body in which the upper surface of the metal sheet, the heat spreader, and the semiconductor element are encapsulated, and at least a portion of the back surface of the metal sheet exposed from the encapsulation resin body.

Advantageous Effect of Invention

According to the present invention, dielectric breakdown can be inhibited in a semiconductor device incorporating a heat spreader.

DESCRIPTION OF EMBODIMENTS

Figure 1:
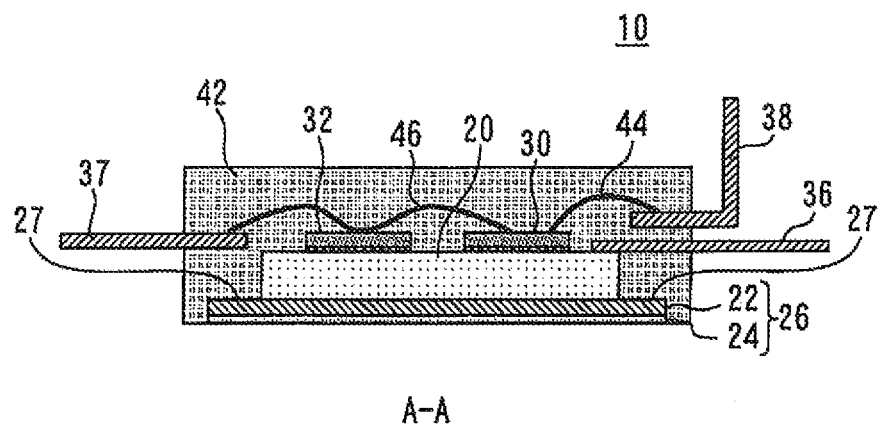
FIG. 1 is a sectional view of a semiconductor device according to Embodiment 1 of the present invention.

Embodiments of the present invention will be described below with reference to the drawings. Elements common to the drawings or corresponding to each other are indicated by the same reference characters, and redundancies in descriptions of them are avoided. The present invention is not limited to the embodiments described below.

Embodiment 1

Construction of Embodiment 1

Figure 2:
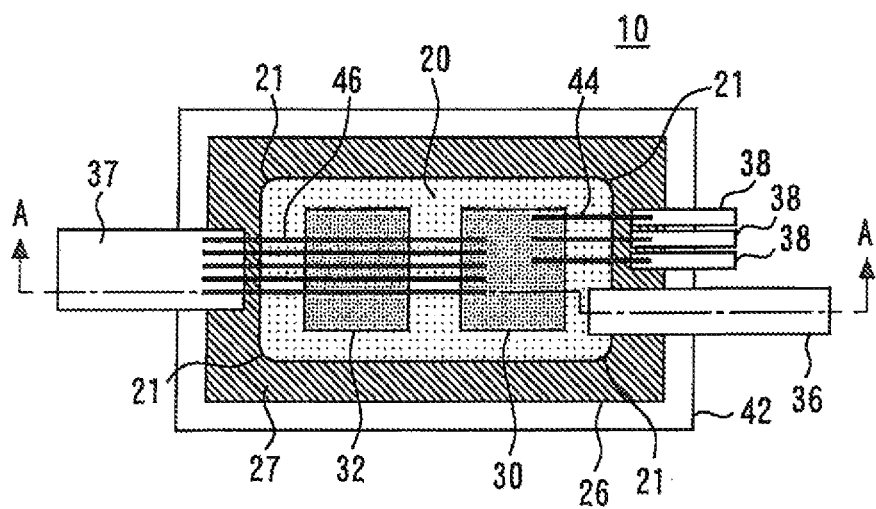
FIG. 2 is a plan view of the semiconductor device according to Embodiment 1 of the present invention.

FIG. 1 is a sectional view of a semiconductor device 10 according to Embodiment 1 of the present invention. FIG. 2 is a plan view of the semiconductor device 10 according to Embodiment 1 of the present invention. FIG. 1 shows a section of the semiconductor device 10 cut along line A-A in FIG. 2. FIG. 2 is a plan view of the semiconductor device 10 shown in FIG. 1, as seen in a top-to-bottom direction along the plane of FIG. 1. FIG. 2 shows the internal structure of the semiconductor device 10 through a molding resin in a see-through manner for convenience sake.

The semiconductor device 10 has a heat spreader 20. The heat spreader 20 is an electrically conductive metal block having a bottom surface. As shown in FIGS. 1 and 2, the heat spreader 20 is, as a whole, in the form of a generally rectangular block, has an upper surface (a surface facing upward as viewed in FIG. 1) and a bottom surface (a surface facing downward as viewed in FIG. 1) facing in opposite directions, and also has side surfaces connecting the upper and bottom surfaces. The material of the heat spreader 20 is copper (Cu) having high heat conductivity and high electrical conductivity.

The semiconductor device 10 has a sheet member 26. The sheet member 26 is a member formed by laying an insulating sheet 22 forming an insulating layer and a metal sheet 24 forming a metal layer. The insulating sheet 22 is formed of an epoxy resin. The metal sheet 24 is copper foil. The insulating sheet 22 may contain an electrically conductive filler.

The sheet member 26 has a front surface and a back surface. The front surface contacts the bottom surface of the heat spreader 20. The back surface is exposed outside the semiconductor device 10 (outside a molding resin 42). The insulating sheet 22 electrically insulates the front and back surfaces of the sheet member 26 from each other.

The sheet member 26 has a peripheral portion 27 that juts out from edges of the bottom surface of the heat spreader 20. The portion of the sheet member jutting out from the edges of the heat spreader bottom surface will hereinafter also be referred to simply as "peripheral portion". As shown in FIG. 2, the peripheral portion 27 juts out in all directions from the edges at four sides of the heat spreader 20, and its size is slightly larger than that of the heat spreader 20.

The semiconductor device 10 has, as semiconductor elements, an insulated gate bipolar transistor (IGBT) 30, and a diode 32, which is a freewheel diode. The IGBT 30 and the diode 32 are fixed by solder on the upper surface of the heat spreader 20. The IGBT 30 and the diode 32 each have a front electrode and a back electrode. Their back electrodes are connected to the heat spreader 20 through the solder, thereby being electrically connected to each other.

The semiconductor device 10 has a main terminal 36, a main terminal 37 and signal terminals 38. Each of these terminals is an electrode plate formed of copper (Cu). The main terminal 36 is directly connected to the heat spreader 20 by solder. The main terminal 37, the diode 32 and the IGBT 30 are connected to each other by a plurality of wires 46 (five wires in the drawing) formed of aluminum (Al). The signal terminals 38 are connected to a gate electrode of the IGBT 30 by a plurality of wires 44 (three wires in the drawing) formed of aluminum (Al).

The semiconductor device 10 has molding resin 42. The molding resin 42 is an encapsulation resin body in which the front surface of the sheet member 26, the heat spreader 20, the IGBT 30 and the diode 32 are encapsulated. Portions of the main terminal 36, the main terminal 37 and the signal terminals 38 are exposed outside the molding resin. The entire back surface of the sheet member 26 is exposed from the molding resin 42.

As shown in FIG. 2, the heat spreader 20 has corner portions 21 at the four corners of the bottom surface of the heat spreader 20. That is, the corner portions 21 are portions of the heat spreader 20 at the four corners as seen in the plan view of the heat spreader 20. The corner portions 21 are portions of the heat spreader 20 having the shapes of curved surfaces as seen in the plan view of the heat spreader 20 (or in the plan view of the semiconductor device 10) as shown in FIG. 2. On the other hand, the corner portions 21 are rectangular as seen in the section of the heat spreader 20 (or in the section of the semiconductor device 10) as shown in FIG. 1. The corner portions 21 according to Embodiment 1 are formed as uniform curved surfaces from the bottom surface to the upper surface of the heat spreader 20.

Figure 3A:
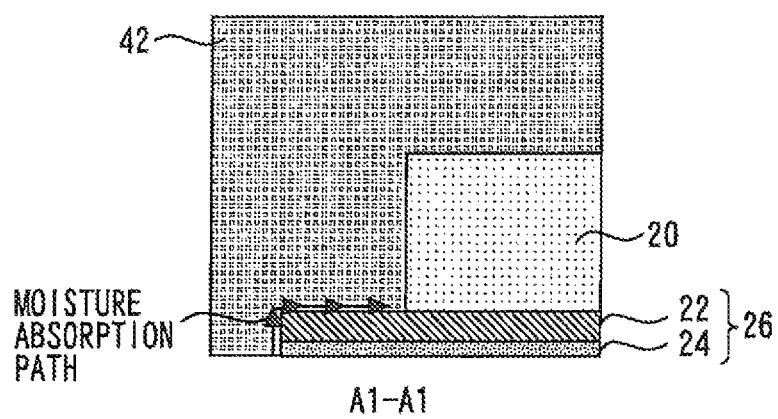
FIG. 3A is a diagram showing the corner portion in a section of the heat spreader.
Figure 3B:
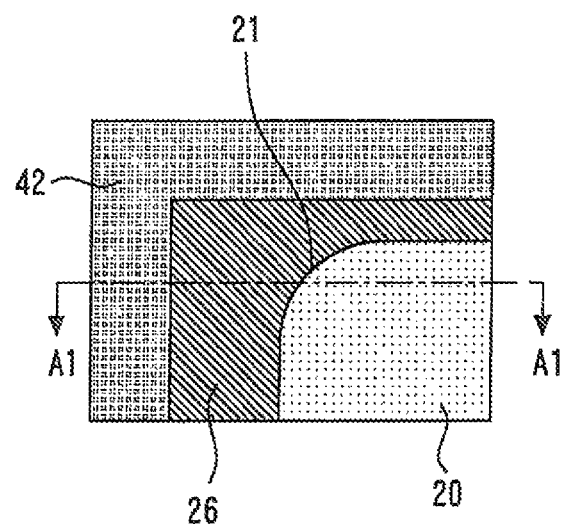
FIG. 3B is a diagram showing the corner portion in a plan view of the heat spreader according to Embodiment 1 of the present invention.

FIG. 3 includes partial sectional views showing the construction of the corner portion 21 of the heat spreader 20 according to Embodiment 1 of the present invention. FIG. 3A is a diagram showing the corner portion 21 in a section of the heat spreader 20. FIG. 3B is a diagram showing the corner portion 21 in a plan view of the heat spreader 20. FIG. 3A is a sectional view taken along line A1-A1 in FIG. 3B.

Functions in Embodiment 1

With a power semiconductor device of a construction similar to that of the semiconductor device 10, there is a problem that water penetrates into the device through the restricted interface between the molding resin and the insulating sheet. This water forms an electrical conduction path between the heat spreader and the copper foil to cause dielectric breakdown. This is because the insulating performance of the insulating material of the insulating sheet in contact with the heat spreader is reduced by hydrolysis of the insulating material with the water.

The inventors of the present invention made analysis to find that such dielectric breakdown occurred with a high frequency at portions of the heat spreader corresponding to the four corners of the same as seen in plan and in contact with the insulating sheet (immediately below corner portions).

A path indicated by arrows in FIG. 3A corresponds to the interface between the molding resin 42 and the sheet member 26 and will be referred to also as "moisture absorption path". The length of the moisture absorption path is substantially equal to the creeping distance. The creeping distance is defined as the shortest distance between two electrically conductive portions along an insulating material interface.

If the surfaces of corner portions of the heat spreader 20, as seen in the plan view of FIG. 3B, are not curved but right-angled, as in the related art, then water having penetrated by passing through two moisture absorption paths shown in FIG. 3B concentrates at the tip of the right-angled corner portion. In contrast, if corner portions 21 having the shape of a curved surface as seen in plan are provided in the way according to the present embodiment, the length of the moisture absorption path can be increased relative to that in the case where corner portions right-angled as seen in plan are provided (that is, the creeping distance can be increased).

The curved surfaces of the corner portions 21 can be formed by rounding (R-beveling). Rounding of the corner portions 21 is performed more broadly than ordinary rounding performed on corner portions of metal blocks. Ordinary rounding may be performed on angled portions of the heat spreader 20 other than the corner portions 21. Rounding of the corner portions 21, however, is performed by setting a radius of rounding larger than the radius of the ordinary rounding. The radius of rounding of the curved surfaces of the corner portions 21 is larger than the radius of rounding of the angled portions of the heat spreader 20 other than the corner portions 21.

In the present embodiment, even when absorption of moisture from the interface between the sheet member 26 and the molding resin 42 occurs, the concentration of water produced by this moisture absorption at the four corner portions of the heat spreader 20 in the semiconductor device 10 can be limited, thus enabling inhibition of dielectric breakdown at the four corners of the heat spreader 20.

One of the causes of the concentration of places of occurrence of dielectric breakdown at the four corners of the heat spreader as described above is the occurrence of electric field concentration at the end portions (acute-angle portions) of the four corner portions of the heat spreader if these portions are pointed. In the present embodiment, such pointed portions can be eliminated since the corner portions 21 are formed as curved surfaces, thus enabling reducing the degree of electric field concentration.

The corner portions 21 according to the present embodiment are rectangular as seen in the sectional view of the heat spreader 20 (or in the sectional view of the semiconductor device 10) and have no such curved-surface shape as that seen in the plan view. In this respect, the corner portions 21 differ from the beveled portions shown in FIG. 7 in Patent Literature 1 (Japanese Patent Laid-Open No. 2011-9410) for example.

The corner portions 21 in the present embodiment have, for example, an advantageous effect described below. As described above, the inventors of the present invention made analysis and study to find that dielectric breakdown can occur easily in small gaps formed between the heat spreader and the insulating sheet at the four corners of the heat spreader. In a case where a construction in which beveling such as R-beveling as seen in section is also performed as described in Patent Literature 1 is adopted, there is a possibility of filling of a small gap formed between the heat spreader and the insulating sheet with the molding resin not being smoothly performed. In the present embodiment, any difficulty such as that in filling with the molding resin in the case where R-beveling or the like as seen in section is performed does not occur since the shape curved as seen in plan but rectangular as seen in section is adopted. That is, in the present embodiment, a molding resin encapsulation process may be performed under the same condition as when a rectangular heat spreader is used. Thus, in the semiconductor device 10 according to the present embodiment, the desired quality of the molding resin encapsulation in the structure as seen in section can be secured while an increase in moisture absorption distance in the structure as seen in plan is achieved, thus achieving improved effects in securing insulation qualities.

As described above, according to the present embodiment, the semiconductor device 10 in which dielectric breakdown between the heat spreader 20 and the insulating layer (insulating sheet 22) of the sheet member 26 is inhibited and the insulation qualities are secured can be provided.

Modified Example of Embodiment 1

Figure 4A:
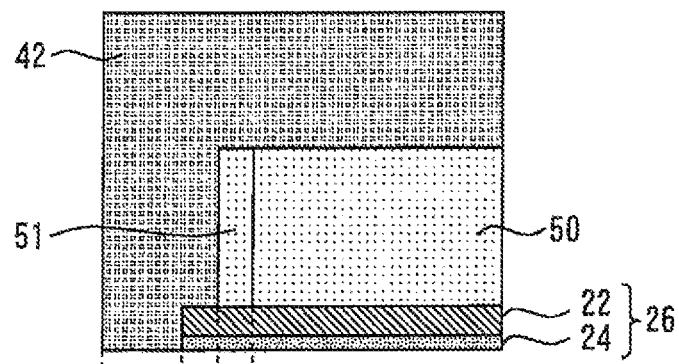
FIG. 4A is a section view showing a modified example of the semiconductor device according to Embodiment 1 of the present invention.
Figure 4B:
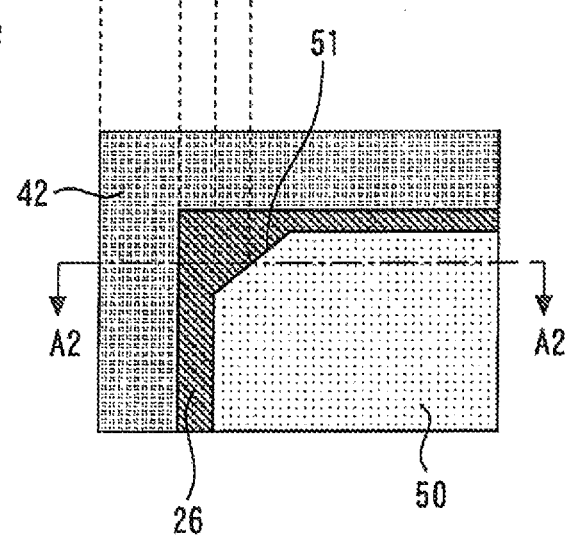
FIG. 4B is a plan view thereof.

FIG. 4 is a diagram showing a modified example of the semiconductor device 10 according to Embodiment 1 of the present invention. This modified example has a heat spreader 50 in place of the heat spreader 20. In other respects, the construction in the modified example is the same as that of the semiconductor device 10 shown in FIGS. 1 and 2. FIG. 4A is a diagram showing a corner portion 51 of the heat spreader 50 as seen in section. FIG. 4B is a diagram showing the corner portion 51 of the heat spreader 50 as seen in plan. FIG. 4A is a sectional view taken along line A2-A2 in FIG. 4B.

The corner portion 51 has a beveled shape as seen in plan and is rectangular as seen in section. The corner portions 51 are formed by performing C-beveling on four corner portions of the heat spreader 20 as seen in plan. The corner portion 51 is as effective as the corner portion 21 in securing insulation qualities and is capable of being easily worked.

Embodiment 2

Construction of Embodiment 2

Figure 5:
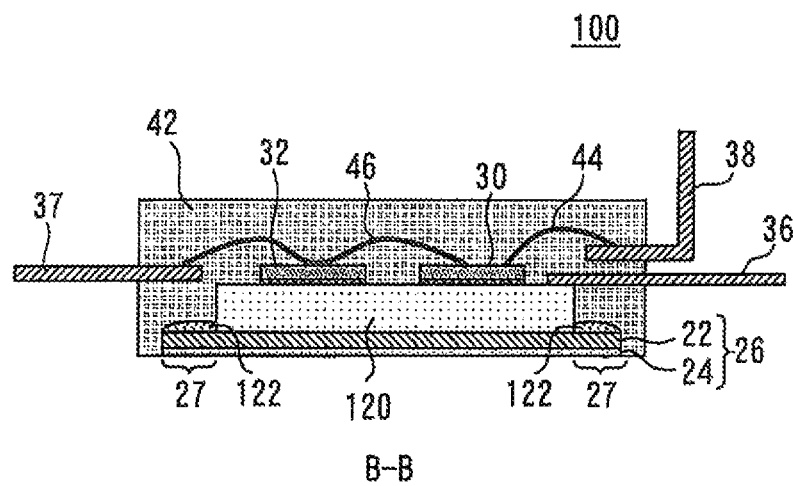
FIG. 5 is a sectional view of a semiconductor device according to Embodiment 2 of the present invention.
Figure 6:
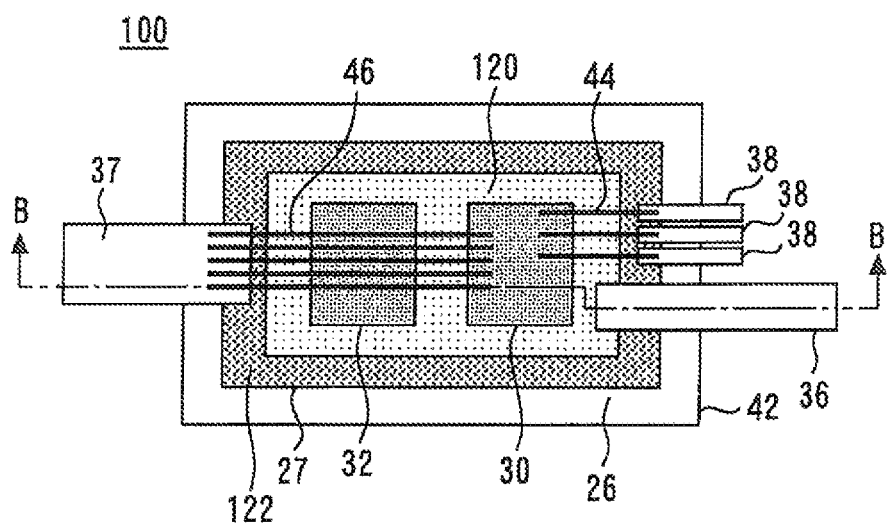
FIG. 6 is a plan view of the semiconductor device according to Embodiment 2 of the present invention.

FIG. 5 is a sectional view of a semiconductor device 100 according to Embodiment 2 of the present invention. FIG. 6 is a plan view of the semiconductor device 100 according to Embodiment 2 of the present invention. FIG. 5 shows a section of the semiconductor device 100 cut along line B-B in FIG. 6. FIG. 6 is a plan view of the semiconductor device 100 shown in FIG. 5, as seen in a top-to-bottom direction along the plane of FIG. 5. FIG. 6 shows the internal structure of the semiconductor device 100 through a molding resin in a see-through manner for convenience sake.

The semiconductor device 100 has the same construction as the semiconductor device 10 according to Embodiment 1 except for two points of difference described below. The first point of difference resides in having a coating layer 122. The second point of difference resides in having a heat spreader 120 in place of the heat spreader 20.

The heat spreader 120 differs from the heat spreader 20 in Embodiment 1 in not having the "corner portions 21 having the shape of a curved surface as seen in plan". The heat spreader 120 has the same construction as the heat spreader 20 except for this point. The heat spreader 120 is also the same as the heat spreader 20 in being a rectangular metal block and being made of copper (Cu).

The coating layer 122 is a layer formed of an electrically insulating coating material. The coating layer 122 is provided on the front surface of the peripheral portion 27. In Embodiment 2, as shown in the plan view of FIG. 6, the coating layer 122 covers the entire peripheral portion 27 so as to surround the heat spreader 120.

As a material for the coating layer 122, a material having higher insulation quality and higher adhesion to the front surface of the sheet member 26 compared with the material of the molding resin 42 is used. Preferably, the material of the coating layer 122 is a material selected from the group consisting of polyimide, polyamide and a polyfunctional epoxy polymer. Also, no electrically conductive filler is mixed in the material of the coating layer 122. Such insulating coating materials have higher adhesion to the insulating sheet 22, because a filler is mixed in the molding resin 42 to ensure high heat dissipation.

Figure 7A:
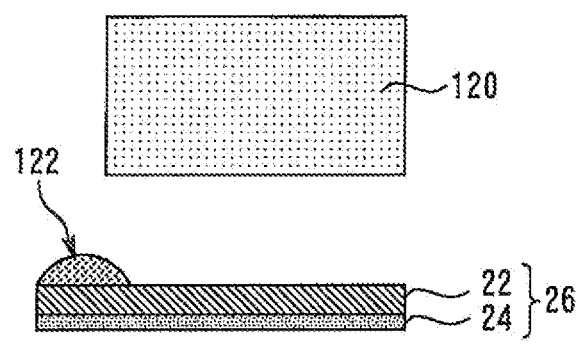
FIGS. 7A and 7B are diagrams showing part of a process of manufacturing the semiconductor device according to Embodiment 2.
Figure 7B:
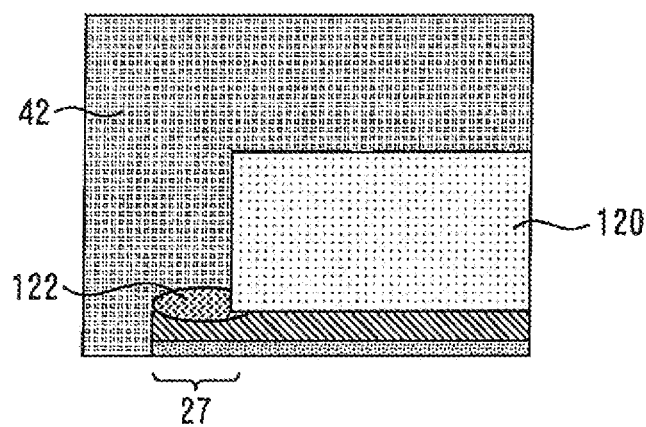

FIG. 7 is a diagram showing part of a process of manufacturing the semiconductor device 100 according to Embodiment 2. As shown in FIG. 7A, the material of the coating layer 122 is applied in advance to the front surface of the sheet member 26 (the front surface of the peripheral portion 27). Thereafter, the heat spreader 120 is placed on the sheet member 26 and a molding resin encapsulation process is carried out. As a result, the construction shown in FIG. 7B is obtained.

Functions in Embodiment 2

In the present embodiment, the coating layer 122 is provided at the interface between the sheet member 26 and the molding resin 42. The coating layer 122 is a layer formed of an insulating coating material. With this coating layer 122, dielectric breakdown can be inhibited even when moisture absorption along the interface occurs. Also, the coating layer 122 is capable of ensuring high insulation compared with the insulating sheet 22 and positively increasing insulation characteristics Inhibition of dielectric breakdown at the four corners of the heat spreader is thus enabled.

Modified Examples of Embodiment 2

Modified Example 1

Figure 8A:
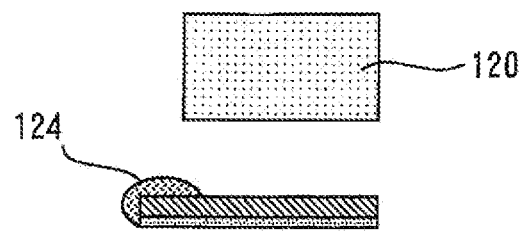
FIGS. 8A and 8B are diagrams showing one of modified examples of the semiconductor device according to Embodiment 2 of the present invention.
Figure 8B:
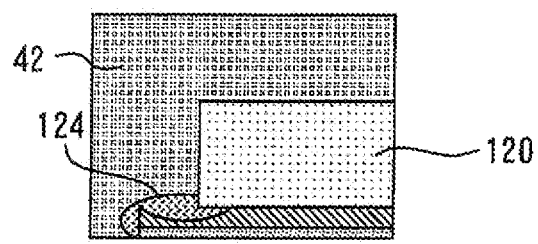

FIG. 8 is a diagram showing one of modified examples of the semiconductor device 100 according to Embodiment 2 of the present invention. A coating layer 124 is provided not only on the front surface of the sheet member 26 but also on side surfaces of end portions of the sheet member 26. The material of the coating layer 124 is the same as that of the coating layer 122.

Modified Example 2

Figure 9A:
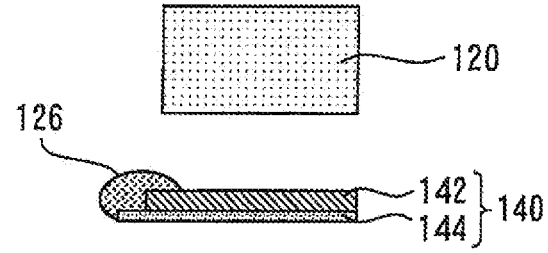
FIGS. 9A and 9B are diagrams showing another one of the modified examples of the semiconductor device according to Embodiment 2 of the present invention.
Figure 9B:
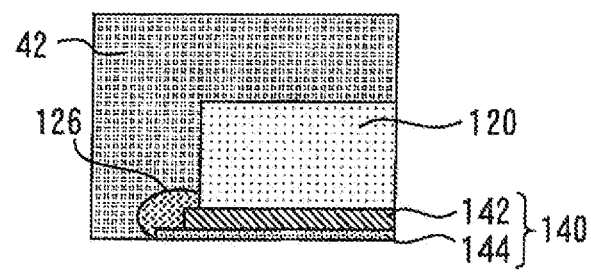

FIG. 9 is a diagram showing another one of the modified examples of the semiconductor device 100 according to Embodiment 2 of the present invention. The semiconductor device according to the modified example shown in FIG. 9 has a sheet member 140. Unlike the sheet member 26, the sheet member 140 has a metal sheet 144, which is slightly larger than an insulating sheet 142. That is, a front surface of the insulating sheet 142 is in contact with the bottom surface of the heat spreader 120. The metal sheet 144 is in contact with a back surface of the insulating sheet 142 and has a peripheral portion that juts out from edges of the insulating sheet 142 and that has an upper surface facing a region on the heat spreader side.

In this modified example, a coating layer 126 is applied to portions from the front surface of the insulating sheet 142 to the upper surface of the metal sheet 144. The material of the coating layer 126 is the same as that of the coating layer 122. In the modified example shown in FIG. 9, high adhesiveness between the coating material and the copper foil can be obtained, and therefore penetration of water can be effectively inhibited.

Modified Example 3

Figure 10A:
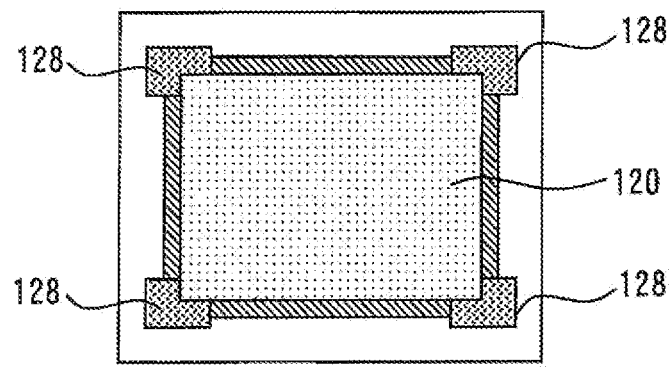
FIGS. 10A to 10C are diagrams showing still another one of the modified examples of the semiconductor device according to Embodiment 2 of the present invention.
Figure 10B:
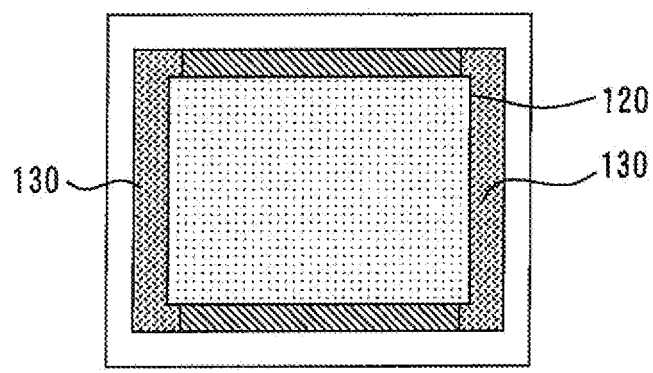
Figure 10C:
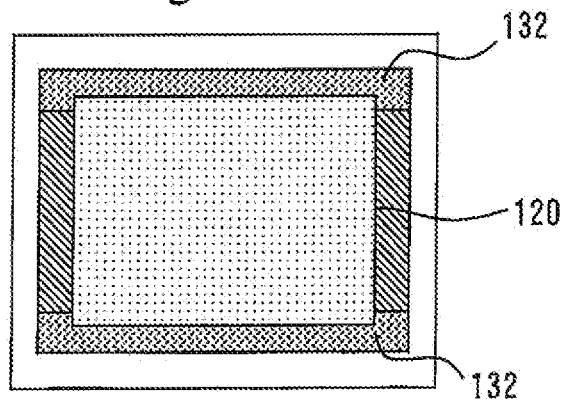

FIG. 10 is a diagram showing still another one of the modified examples of the semiconductor device 100 according to Embodiment 2 of the present invention. FIG. 10 corresponds to the plan view of the semiconductor device 100 in FIG. 6. In FIG. 10, a simplified illustration of the internal construction is made. A coating layer 128 may be locally provided only at the four corners of the heat spreader 120, as shown in FIG. 10A. Since the coating layer 128 is provided at the four corners of the heat spreader 120 where the frequency of occurrence of dielectric breakdown is high, a certain dielectric breakdown inhibition effect can be ensured. Also, a small amount of the coating material suffices, which means a reduction in cost. A coating layer 130 may be locally provided only at the shorter sides of the heat spreader 120, as shown in FIG. 10B. A coating layer 132 may be locally provided only at the longer sides of the heat spreader 120, as shown in FIG. 10C. The material of each coating layer is assumed to be the same as that of the coating layer 122.

Embodiment 3

A semiconductor device according to Embodiment 3 of the present invention will be described below. The semiconductor device according to Embodiment 3 and modified examples thereof described below have in common a construction in which a molding resin covers a peripheral portion of a sheet member from a front surface to a back surface of the peripheral portion of the sheet member.

Construction of Embodiment 3

Figure 11:
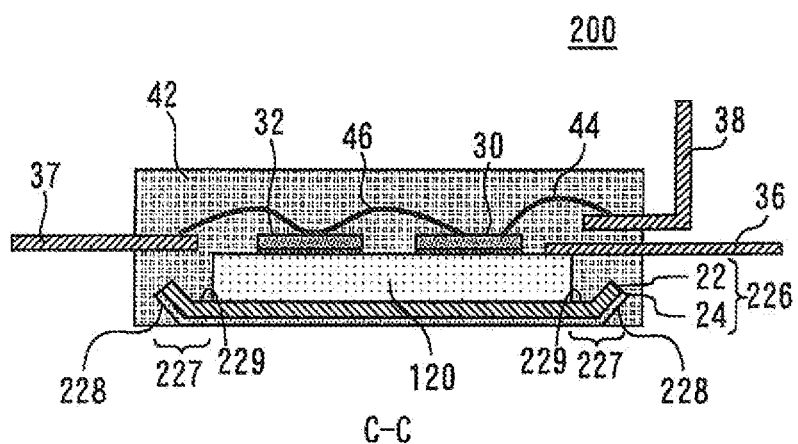
FIG. 11 is a sectional view of a semiconductor device according to Embodiment 3 of the present invention.
Figure 12:
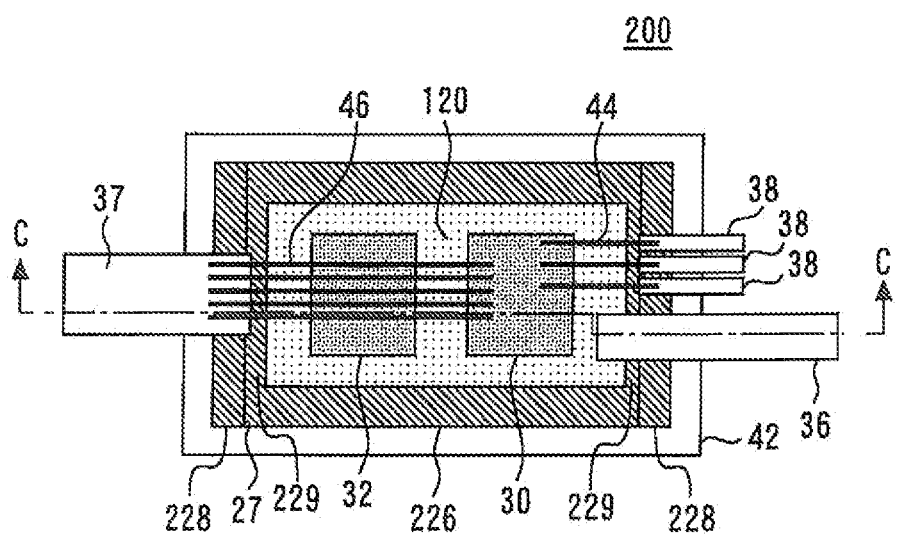
FIG. 12 is a plan view of the semiconductor device according to Embodiment 3 of the present invention.

FIG. 11 is a sectional view of a semiconductor device 200 according to Embodiment 3 of the present invention. FIG. 12 is a plan view of the semiconductor device 200 according to Embodiment 3 of the present invention. FIG. 11 shows a section of the semiconductor device 200 cut along line C-C in FIG. 12. FIG. 12 is a plan view of the semiconductor device 200 shown in FIG. 11, as seen in a top-to-bottom direction along the plane of FIG. 11. FIG. 12 shows the internal structure of the semiconductor device 200 through the molding resin in a see-through manner for convenience sake.

The semiconductor device 200 has the same construction as the semiconductor device 10 according to Embodiment 1 except for two points of difference described below. The first point of difference resides in having a sheet member 226 in place of the sheet member 26. The second point of difference resides in having a heat spreader 120 described in Embodiment 2 in place of the heat spreader 20.

The sheet member 226 differs from the sheet member 26 in having bent portions 228. The sheet member 226 and the sheet member 26 have common features or components in other respects, that is, the sheet member 226 has the multilayer structure formed of the insulating sheet 22 and the metal sheet 24, and a peripheral portion 227 corresponding to the peripheral portion 27.

The peripheral portion 227 of the sheet member 226 includes a plane portion 229 and the bent portions 228. The plane portion 229 is a portion extending parallel to the bottom surface of the heat spreader 120. The bent portions 228 are portions provided outside the plane portion 229 along the shorter sides of the heat spreader 120 and are bent so as to rise on the heat spreader 120 side. In the present embodiment, the bent portions 228 are formed by bending the sheet member 226 as shown in FIG. 11.

Figure 13A:
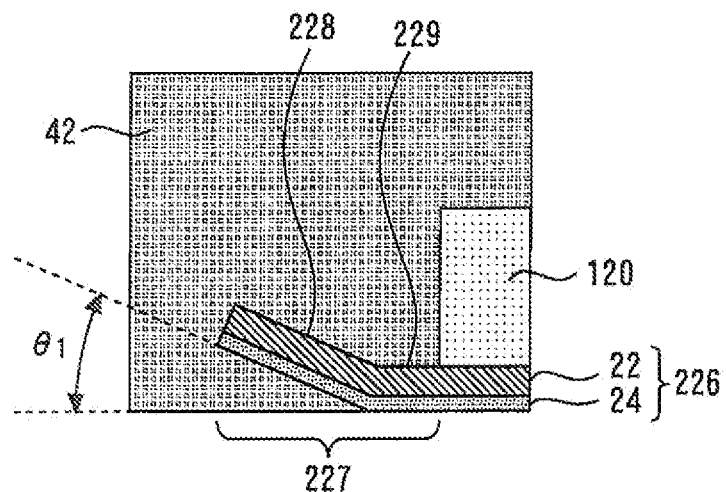
FIG. 13A is a partial sectional view schematically showing the vicinity of the bent portion according to Embodiment 3 of the present invention.

FIG. 13A is a partial sectional view schematically showing the vicinity of the bent portion 228 according to Embodiment 3 of the present invention. In the present embodiment, the bent portions 228 are formed by bending the sheet member 226 through an angle $\theta_1$.

Figure 13B:
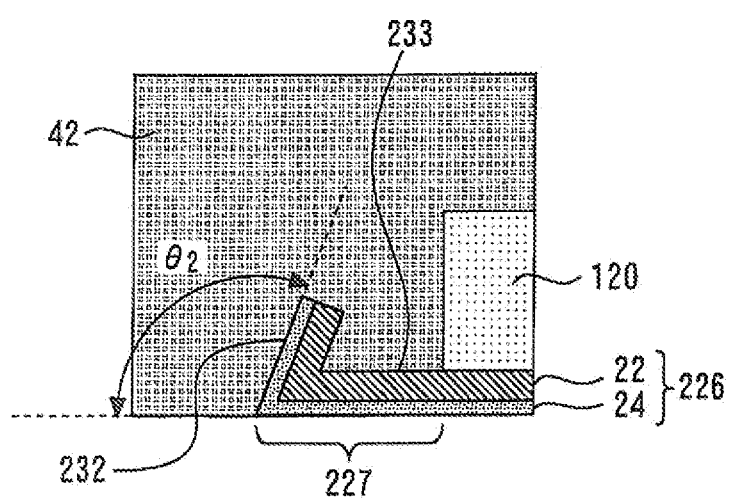
FIG. 13B shows a modified example thereof.

This angle $\theta_1$ is an acute angle. However, the present invention is not limited to this. Bent portions 232 and a plane portion 233 may be provided by setting an obtuse angle, e.g., an angle $\theta_2$ shown in FIG. 13B. Preferably, the angle $\theta$ is set within a range from 15 degrees to 165 degrees from the lower surface of the package of the semiconductor device 200 (or a plane parallel to the bottom surface of the heat spreader 120). In a case where the angle $\theta$ is an obtuse angle (i.e., an angle exceeding 90 degrees), it is preferable that the width of the plane portion 233 be larger than that of the bent portions 232, as shown in FIG. 13B.

Also in Embodiment 3, the internal components of the semiconductor device are encapsulated in the molding resin 42, as are those in Embodiments 1 and 2 described above. That is, the molding resin 42 is an encapsulation resin body in which the front surface of the sheet member 226, the heat spreader 120 and semiconductor elements including the IGBT 30 are encapsulated, and out of which a back surface of the sheet member 226 is exposed. In Embodiment 3, the molding resin 42 is formed around to the back surface side of the sheet member 226 (the back surface side of the metal sheet 24), as shown in FIG. 13. Thus, the molding resin 42 covers part of the back surface of the sheet member 226 in the bent portion 228.

Functions in Embodiment 3

In the present embodiment, the moisture absorption distance along the interface between the peripheral portion 227 of the sheet member 226 and the molding resin 42 can be increased since the molding resin 42 covers part of the back surface of the sheet member 226 in the bent portion 228. That is, the creeping distance between the sheet member 226 and the heat spreader 120 can be increased. Moisture absorption that may cause dielectric breakdown can thus be inhibited to inhibit dielectric breakdown at the heat spreader.

Since the adhesion force between the metal sheet (copper foil) and the molding resin is high, moisture absorption can be further inhibited by increasing the area of bonding therebetween.

Further, in Embodiment 3, an advantage in terms of the manufacturing process can be obtained, as described below. That is, in Embodiment 3, the peripheral portion 227 includes the plane portion 229. With the plane portion 229, a certain spacing can be provided in the surface of the sheet member 226 between the bent portions 228 and the heat spreader 120. A design margin can be secured in this way, such that the bends of the bent portions 228 can be secured even when an error in positioning of the heat spreader 120 occurs in the manufacturing process.

That is, if peripheral portions of the sheet member are bent at positions close to the edges of the heat spreader 120 as shown in Patent Literature 1 (Japanese Patent Laid-Open No. 2011-9410), then there is a possibility of the heat spreader 120 being put on a bent portion in the peripheral portions of the sheet member when an error in positioning of the heat spreader 120 occurs in placement with an automatic controller. If the heat spreader 120 is put on a bent portion in the peripheral portions of the sheet member, a force is applied so as to reduce the bend when the heat spreader 120 is pressed. The peripheral portions are thereby pressed so that the sheet member is flattened.

In Embodiment 3, the possibility of such a fault can be reduced since a design margin is secured with the plane portion 229.

Modified Example of Embodiment 3

Modified examples of Embodiment 3 will be described below with reference to the drawings. The figures referred to below show the internal structure of the semiconductor device 200 through the molding resin 42 in a see-through manner for convenience sake. In the figures, simplified illustrations of constructions are made. More specifically, illustrations of the constructions are omitted or simplified with respect to components other than the molding resin 42, the heat spreader 120 and the sheet member 226.

Modified Example 1

Figure 14A:
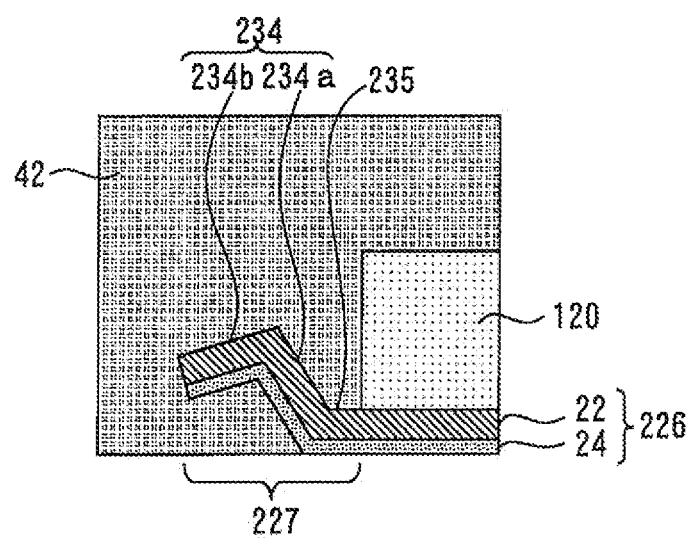
FIGS. 14A and 14B are schematic diagrams showing modified examples of the semiconductor device according to Embodiment 3 of the present invention.

FIG. 14 is a schematic diagram showing a modified example of the semiconductor device 200 according to Embodiment 3 of the present invention. FIG. 14 corresponds to the sectional view shown in FIG. 13A and shows a modification of the structure as viewed in section in FIG. 13A. A plane portion 235 and a bent portion 234 may be provided in the peripheral portion 227, as shown in FIG. 14A. The bent portion 234 may include a first bent portion 234a and a second bent portion 234b. The first bent portion 234a is a portion connected to the plane portion 235 and bent toward the heat spreader 120 (toward the upper surface of the package of the semiconductor device 200). The second bent portion 234b is a portion connected to the first bent portion 234a and bent toward the lower surface of the package of the semiconductor device 200.

Figure 14B:
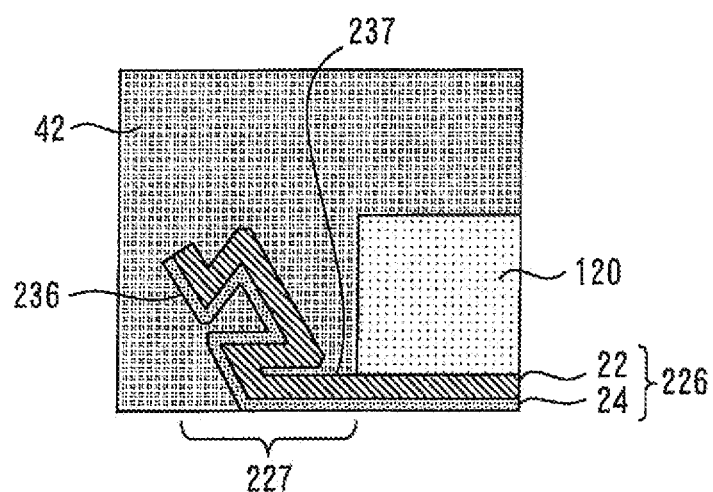

Bending into two or more folds may be performed. For example, an omega-shaped bent portion 236 may be provided together with the plane portion 237, as shown in FIG. 14B. The moisture absorption distance (creeping distance) can be further increased by increasing the number of bends in the restricted space in this way.

Modified Example 2

Figure 15:
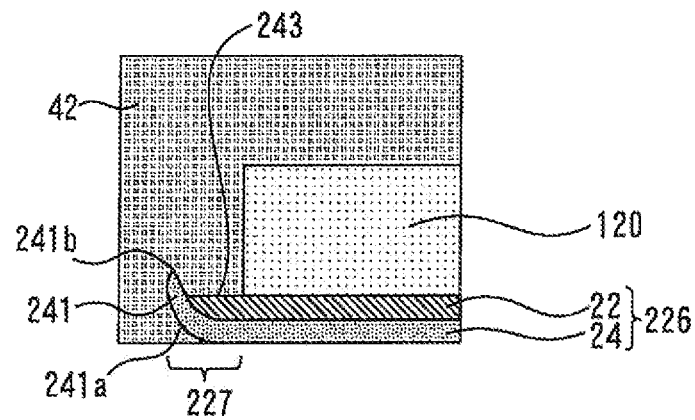
FIG. 15 is a schematic diagram showing a modified example of the semiconductor device according to Embodiment 3 of the present invention.

FIG. 15 is a schematic diagram showing a modified example of the semiconductor device 200 according to Embodiment 3 of the present invention. FIG. 15 corresponds to the sectional view shown in FIG. 13A and shows a modification of the structure as viewed in section in FIG. 13A. As shown in FIG. 15, a plane portion 243 and a bent portion 241 are provided in the peripheral portion 227. The bent portion 241 provided in an end portion of the metal sheet 24 (copper foil) includes an undercut face 241a and a burr face 241b. The molding resin covers the surface of the undercut face 241a and the burr face 241b juts out, so that the moisture absorption distance (creeping distance) can be increased in comparison with the case where the bent portion 241 is right-angled without having the undercut face 241a.

A larger copper foil undercut can be formed if the clearance between upper and lower molds for cutting is increased at the time of cutting the sheet member. Control of the clearance size of the molds in the manufacturing process suffices therefor. Therefore, there is no need for any additional process step and the resulting increase in manufacturing cost can be limited.

Figure 16:
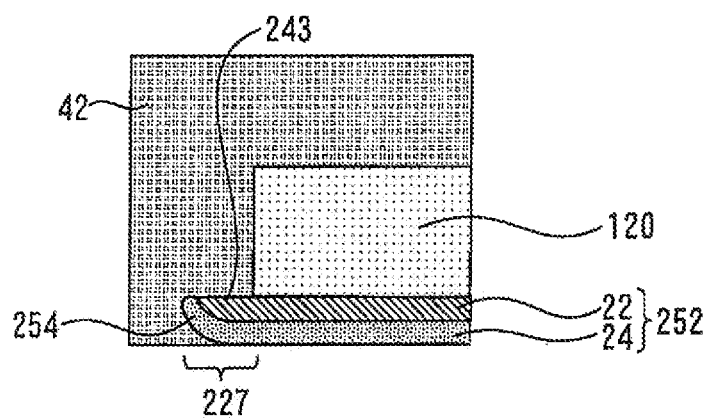
FIG. 16 is a schematic diagram showing a modified example of the semiconductor device according to Embodiment 3 of the present invention.

FIG. 16 is a schematic diagram showing a modified example of the semiconductor device 200 according to Embodiment 3 of the present invention, modified based on the same concept as the example shown in FIG. 15. While a burr is not so large as the burr face 241*b* shown in FIG. 15, an undercut face 254 shown in FIG. 16 can also be covered with the molding resin. As a result, the moisture absorption distance (creeping distance) can also be increased.

Modified Example 3

Figure 17:
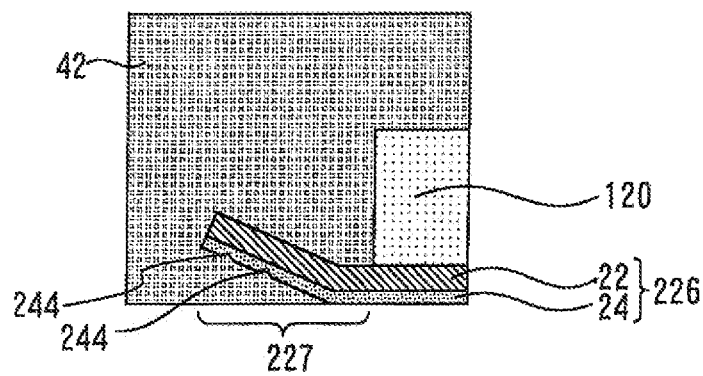
FIG. 17 is a schematic diagram showing a modified example of the semiconductor device according to Embodiment 3 of the present invention.

FIG. 17 is a schematic diagram showing a modified example of the semiconductor device 200 according to Embodiment 3 of the present invention. In the modified example shown in FIG. 17, two grooves 244 are provided in the back surface of the bent portion 228. The grooves 244 extend continuously along a direction perpendicular to the plane of FIG. 17 and are provided in linear groove form by cutting the surface of the material (metal sheet 24) by scribing. With these grooves, the moisture absorption distance (creeping distance) can be increased. As a result of the provision of the projection-recess configuration with the grooves 244, the area of bonding between the molding resin 42 and the metal sheet 24 surface can be increased to improve the adhesion. Only one groove 244 may be provided. Three or more grooves 244 may alternatively be provided. The grooves 244 may be provided not continuously but discontinuously at predetermined intervals.

Modified Example 4

Figure 18:
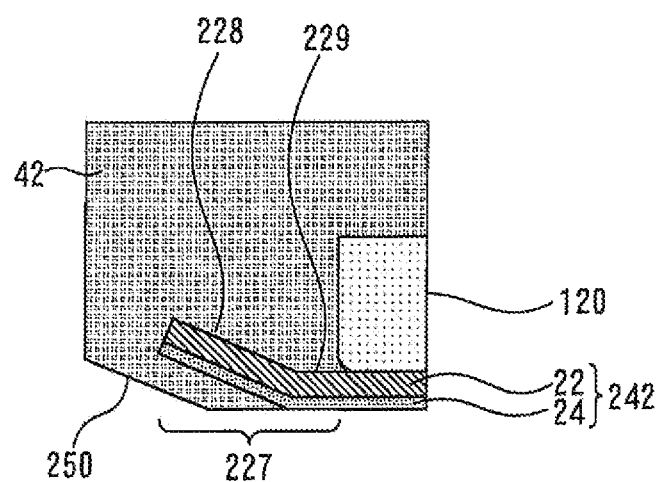
FIG. 18 is a schematic diagram showing a modified example of the semiconductor device according to Embodiment 3 of the present invention.

FIG. 18 is a schematic diagram showing a modified example of the semiconductor device 200 according to Embodiment 3 of the present invention. A beveled portion 250 is provided in the molding resin 42 in the vicinity of the peripheral portion 227. The angle of beveling may be set equal to the angle of the bent portion in the peripheral portion. The size of the package and the amount of the molding resin used can be reduced thereby to achieve a cost reduction effect. As shown in FIG. 18, a bottom corner portion of the heat spreader 120 may be beveled in the vicinity of the bent portion to have the shape of a curved surface as seen in section. Linear beveling (C-beveling) may be performed instead of beveling for forming the curved surface.

Modified Example 5

FIG. 19 is a schematic diagram showing modified examples of the semiconductor device 200 according to Embodiment 3 of the present invention. FIG. 19 shows the internal structure of the semiconductor device 200 through the molding resin 42 in a see-through manner for convenience sake. FIG. 19 is a simplified diagram showing only the heat spreader 120 and the sheet member 226. In the modified examples described above with reference to FIGS. 14 to 16, the structure as seen in section of the peripheral portion 227 in the semiconductor device 200 is variously changed. On the other hand, in the modified examples shown in FIG. 19, the position in which the peripheral portion 227 is provided in the semiconductor device 200, as seen in plan, is variously changed.

Figure 19A:
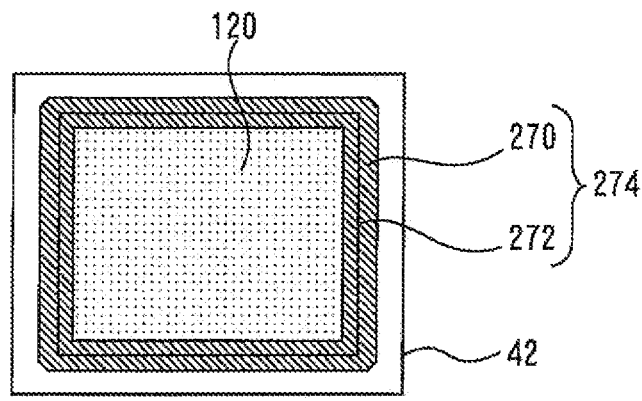
FIGS. 19A to 19C are schematic diagrams showing modified examples of the semiconductor device according to Embodiment 3 of the present invention.

In the modified example shown in FIG. 19A, a construction is adopted in which a plane portion 272 and a bent portion 270 are provided in a peripheral portion 274 along all the four sides of the sheet member 226.

Figure 19B:
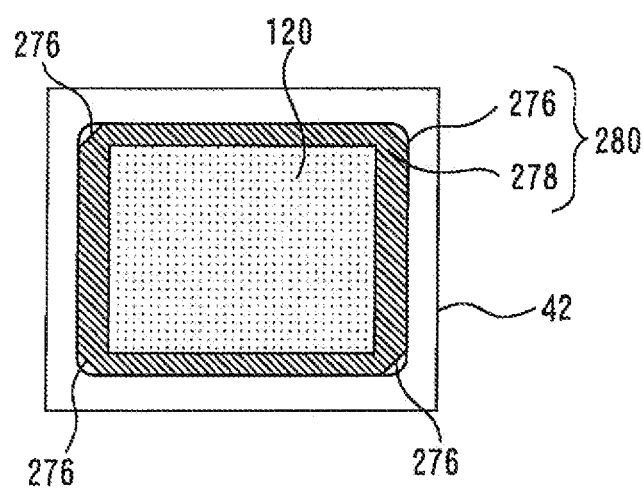

In the modified example shown in FIG. 19B, a construction is adopted in which a plane portion 278 and bent portions 276 are locally provided at the four corners of the sheet member 226. Bent portions may be locally provided only at the four corners of the heat spreader where the frequency of occurrence of dielectric breakdown is high.

Figure 19C:
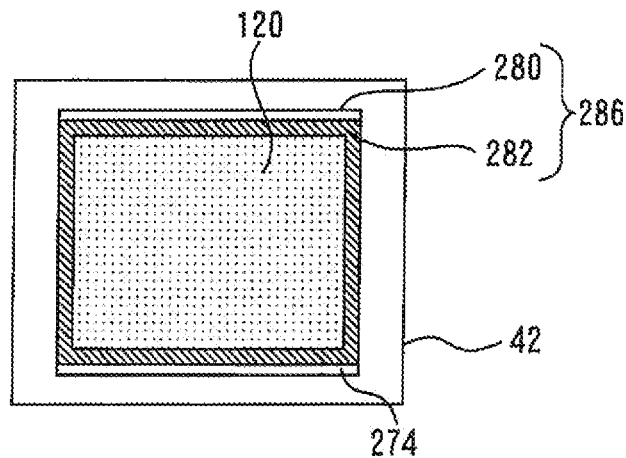

In the modified example shown in FIG. 19C, a construction is adopted in which a plane portion 282 and a bent portion 280 are provided in a peripheral portion 286 at the two opposite longer sides of the sheet member 226. This construction is advantageous, for example, in that the facility with which bending is performed is improved and the cost of the bending process step is low in comparison with the construction in which bent portions are provided along all the four sides.

In the modified examples shown in FIG. 19, the plane portions and the bent portions may have the same sectional shapes as those in the construction shown in FIG. 13 of Embodiment 3 or those in the modified examples shown in FIGS. 14 to 16.

Embodiment 4

A semiconductor device manufacturing method according to Embodiment 4 of the present invention will be described below. The manufacturing method according to Embodiment 4 is a method for manufacturing a semiconductor device having bent portions provided in a peripheral portion of the sheet member 226 in the same way as in Embodiment 3. Each of FIGS. 20 to 23 referred to below is simplified so as to show only its half on the left hand side on its projection plane since it is bilaterally symmetric.

While FIGS. 20 to 23 are simplified schematic diagrams, the heat spreader 120, the sheet member 226, the IGBT 30 and the diode 32 as power semiconductor elements and the molding resin 42 are actually provided, as in the semiconductor device 200. Other component parts: the wires 44 and 46, the signal terminals 38 and the main terminals 36 and 37 are also provided, as in the semiconductor device 200. The places in which these component parts are mounted and the relative positional relationships between these component parts are the same as those shown in FIGS. 11 and 12.

Figure 20A:
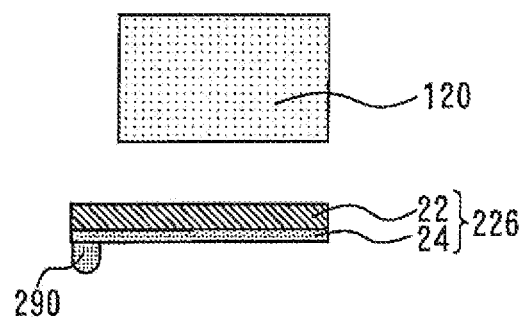
FIGS. 20A and 20B are schematic diagrams for explaining the semiconductor device manufacturing method according to Embodiment 4 of the present invention.

FIG. 20 is a schematic diagram for explaining the semiconductor device manufacturing method according to Embodiment 4 of the present invention. In the manufacturing method according to Embodiment 4, a preparation step is performed as a first step. In the preparation step, the heat spreader 120, the semiconductor elements (IGBT 30 and diode 32) and the sheet member 226 are prepared. In addition, the wires 44 and 46, the signal terminals 38 and the main terminals 36 and 37 are also prepared, as in the semiconductor device 200.

In Embodiment 4, a projection 290 is provided as "bent portion forming means" for the peripheral portion 227 of the sheet member 226. The bent portion forming means is means for bending the peripheral portion of the sheet member 226. Preferably, the projection 290 is formed of a resin material in order to secure workability and insulation with the resin material. More specifically, the back surface of an end portion of the sheet member 226 is continuously (or discontinuously) coated with the insulating material along each side from one to the other end of the side. The coating material is cured to form the projection 290.

An upper mold 291*a* and a lower mold 291*b* are molds for molding the molding resin. Illustration of a resin injection path is omitted. The component parts to be encapsulated including the heat spreader 120 and the sheet member 226 are placed in the cavity formed by the upper mold 291*a* and the lower mold 291*b* for molding the molding resin. The heat spreader 120 is placed on the front surface of the sheet member 226 so as to form the peripheral portion 227 jutting out from the edges of the bottom surface of the heat spreader 120.

Figure 20B:
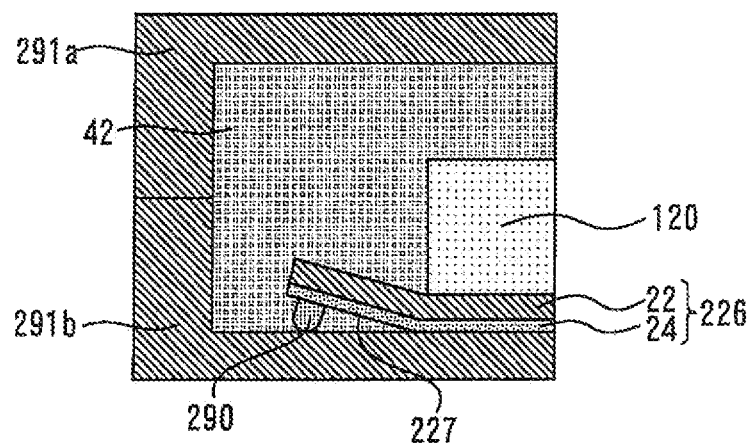

At this time, the projection 290 functions as bent portion forming means, and the peripheral portion 227 of the sheet member 226 is bent by the heat spreader 120 and the projection 290 as shown in FIG. 20B. The manufacturing method shown in FIG. 20 enables bending the end portion of the sheet member 226 with existing molds (upper mold 291a and lower mold 291b) by working the sheet member 226 (by applying the coating material).

In a state where bending on the peripheral portion is completed, a resin encapsulation step is carried out, as shown in FIG. 20B. The front surface of the sheet member 226, the back surface of the peripheral portion 227, the heat spreader 120, the semiconductor elements including the IGBT 30, and the component parts including the main terminals and wires not illustrated can thereby be encapsulated in the molding resin 42. The molding resin 42 does not penetrate to the back surface of the sheet member 226 in contact with the bottom surface of the lower mold 291b (i.e., the back surface of part of the metal sheet 24), so that at least a portion of the back surface of the sheet member 226 is exposed out of the molding resin 42.

Modified Example 1

Figure 21:
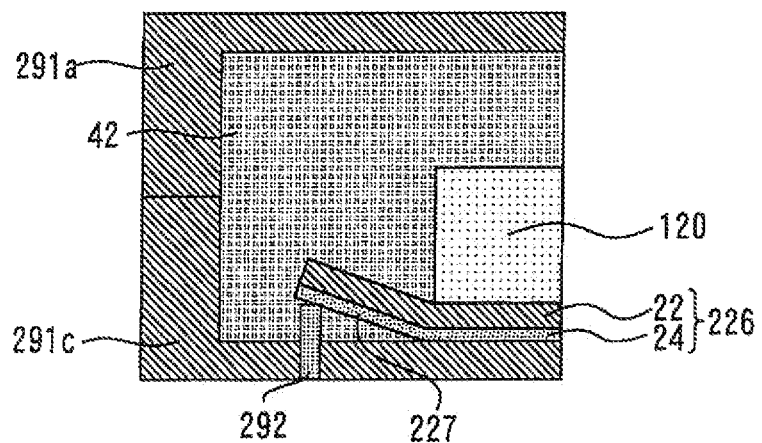
FIG. 21 is a schematic diagram for explaining a modified example of the semiconductor device manufacturing method according to Embodiment 4 of the present invention.

The bent portion forming means may alternatively be pins provided in the cavity bottom surface in the mold and capable of projecting into the cavity. FIG. 21 is a schematic diagram for explaining a modified example of the semiconductor device manufacturing method according to Embodiment 4 of the present invention. Referring to FIG. 21, a through hole and a movable pin 292 capable of being axially advanced and retreated in the through holes are provided in a lower mold 291c. The end portion of the sheet member 226 is placed at a position at which the tip of the movable pin 292 contacts the sheet member 226. The movable pin 292 is then advanced. The end portion of the sheet member 226 can thus be bent, as shown in FIG. 21.

For example, in the molding step, bending may first be performed by pressing the movable pin 292 and, after the completion of forming of the bent portion by bending, injection of the molding resin may be performed while the movable pin 292 is in the retreated state. The process may alternatively be such that molding resin is injected while the movable pin 292 is in the projecting state and a hole formed by the movable pin 292 is filled with the resin. A plurality of movable pins 292 may be provided along edges of the predetermined region where the sheet member 226 is disposed.

Modified Example 2

Figure 22:
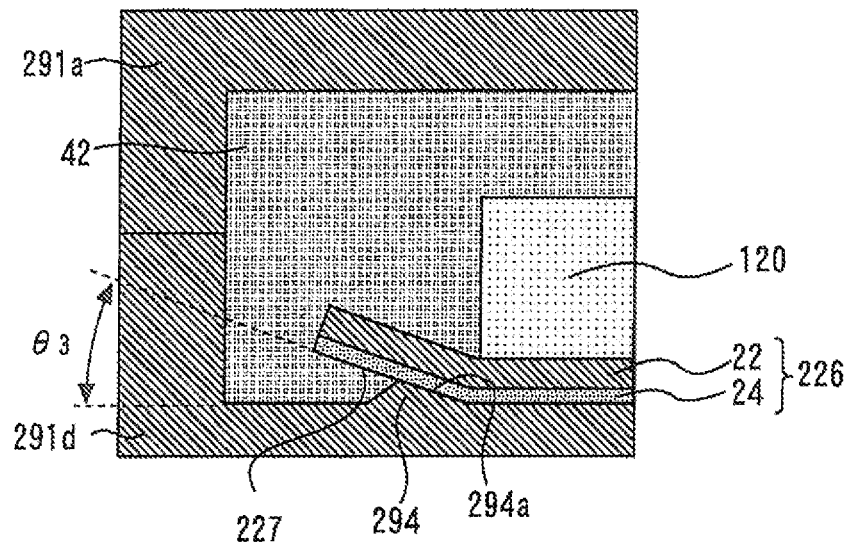
FIG. 22 is a schematic diagram for explaining a modified example of the semiconductor device manufacturing method according to Embodiment 4 of the present invention.

The bent portion forming means may alternatively be a projecting portion provided on the cavity bottom surface in the mold. FIG. 22 is a schematic diagram for explaining a modified example of the semiconductor device manufacturing method according to Embodiment 4 of the present invention. In the manufacturing method shown in FIG. 22, a molding resin encapsulation step is carried out by using a lower mold 291d having a projecting portion 294 on the bottom surface. The projecting portion 294 has a sloping surface 294a having an inclination at an angle $\theta_3$.

The sheet member 226 is disposed so that the back surface of its end portion abuts on the sloping surface 294a, and the heat spreader 120 is disposed on the right hand side on the plane of FIG. 22 of the projecting portion 294 as viewed in FIG. 22. The end portion of the sheet member 226 can thereby be bent through the intended angle with accuracy, as shown in FIG. 22.

Modified Example 3

The bent portion forming means may alternatively be a combination of a first pin provided in the cavity bottom surface in the mold and capable of projecting into the cavity and a second pin provided in the cavity upper surface of the mold so as to be opposed to the first pin and capable of projecting into the cavity. The distance between the first pin and the second pin is set close or equal to the size of the peripheral portion 227.

Figure 23:
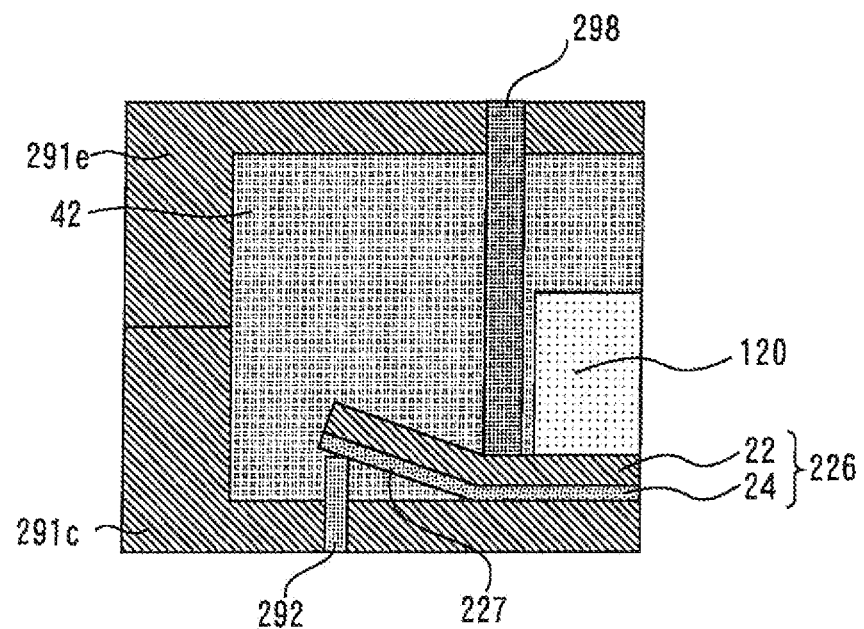
FIG. 23 is a schematic diagram for explaining a modified example of the semiconductor device manufacturing method according to Embodiment 4 of the present invention.

FIG. 23 is a schematic diagram for explaining a modified example of the semiconductor device manufacturing method according to Embodiment 4 of the present invention. In the manufacturing method shown in FIG. 23, the lower mold 291c having the above-described movable pin 292 and the upper mold 291e having a movable pin 298 are used. The end portion of the sheet member 226 is placed at a position at which the tip of the movable pin 292 contacts the sheet member 226. The movable pin 292 is then advanced. At this time, the movable pin 298 is also pressed so that the tip of the movable pin 298 presses the front surface of the sheet member 226 in the vicinity of the periphery of the heat spreader 120 as shown in FIG. 23. The end portion of the sheet member 226 can thereby be bent, as shown in FIG. 23. Further, the bending stability is improved by pressing with the movable pin 298.

For example, in the molding step, bending may first be performed by pressing the movable pins 292 and 298 and, after the completion of forming of the bent portion by bending, injection of the molding resin may be performed while the movable pins 292 and 298 are in the retreated state. The process may alternatively be such that molding resin is injected while the movable pins 292 and 298 are in the projecting state and holes formed by the movable pins 292 and 298 are filled with the resin.

A plurality of movable pins 292 may be provided along edges of the predetermined region where the sheet member 226 is disposed. Also, a plurality of movable pins 298 may be provided along the outer periphery of the predetermined region where the heat spreader 120 is disposed.

Embodiment 5

FIG. 24 includes schematic sectional views partially showing the vicinity of a peripheral portion of a semiconductor device 202 according to Embodiment 5 of the present invention. The semiconductor device 202 shown in FIG. 24 and the semiconductor device 200 according to Embodiment 3 have a common feature in covering part of the back surface of the sheet member 226 with the molding resin 42. However, the semiconductor device 202 shown in FIG. 24 also has other technical features described below.

The construction of the semiconductor device 202 according to Embodiment 5 shown in FIG. 24 will first be described. The semiconductor device 202 has the heat spreader 120, the sheet member 226, the IGBT 30 and the diode 32 as power semiconductor elements and the molding resin 42, as does the semiconductor device 200. The semiconductor device 202 also has the wires, the signal terminals and the main terminals, as does the semiconductor device 200.

Figure 24A:
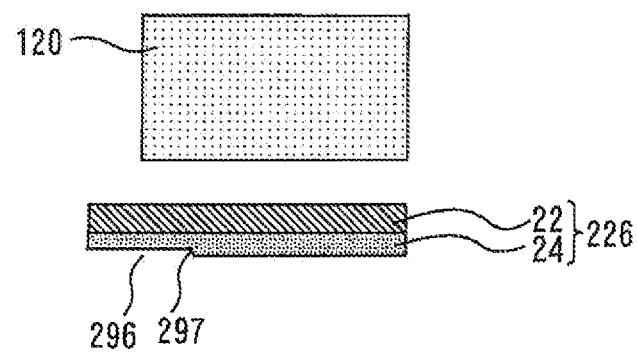
FIGS. 24A and 24B include schematic sectional views partially showing the vicinity of a peripheral portion of a semiconductor device according to Embodiment 5 of the present invention.
Figure 24B:
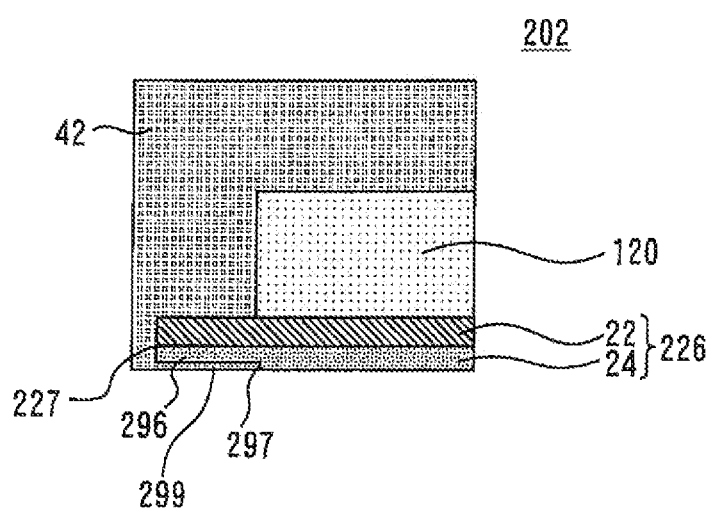

FIG. 24A is an enlarged sectional view of the vicinity of the peripheral portion, showing a state before mounting the heat spreader 120 in the course of manufacturing of the semiconductor device 202. FIG. 24B is an enlarged sectional view of the vicinity of the peripheral portion of the semiconductor device 202 after molding resin encapsulation. The construction is the same as that of the semiconductor device 200 according to Embodiment 3 as to components other than the molding resin 42, the heat spreader 120 and the sheet member 226. That is, the semiconductor device 202 also has the wires 44 and 46, the signal terminals 38 and the main terminals 36 and 37, as does the semiconductor device 200. The places in which these component parts are mounted and the relative positional relationships between these component parts are the same as those shown in FIGS. 11 and 12. Therefore, illustration of them is omitted for ease of description.

As shown in FIG. 24A, the sheet member 226 has a smaller-thickness portion 296 in the peripheral portion 227. The smaller-thickness portion 296 is a portion reduced in thickness so that a step 297 is produced in the back surface of the sheet member 226 (i.e., the surface of the metal sheet 24). The thickness of the smaller-thickness portion 296 is set to ½ of the thickness of at the center side (larger-thickness portion) of the sheet member 226. The step 297 is continuously provided from a position in the back surface in the vicinity of the end portion of the sheet member 226 to the tip of the peripheral portion 227. As shown in FIG. 24B, in the semiconductor device 202 in which molding resin encapsulation is performed, the molding resin 42 has a step resin encapsulation portion 299 covering the step 297.

On the other hand, in Embodiment 5, the entire peripheral portion 227 is formed as a plane portion unlike the peripheral portion 227 in the semiconductor device 200 including the bent portion 228. That is, bending or the like is not performed on the end portion of the sheet member 226.

In Embodiment 5, functions and effects described below are obtained.

First, part of the back surface of the sheet member 226 can be covered with the molding resin 42. The smaller-thickness portion 296 exists from a position in the back surface in the vicinity of the end portion of the sheet member 226 to the tip of the peripheral portion 227, and is encapsulated in the molding resin 42. Accordingly, the length of the water penetration path is reliably increased by a value corresponding to the interface between the smaller-thickness portion 296 and the molding resin 42. A moisture absorption distance (creeping distance) increase effect and a molding resin adhesion improvement effect are obtained.

Also, the adhesion force between the metal sheet (copper foil in the present embodiment) and the molding resin is higher than the adhesion force between the metal sheet (copper foil in the present embodiment) and insulating layer (insulating sheet). Also, an anchoring effect can be produced by increasing the surface area of the metal sheet (copper foil in the present embodiment) to be brought into contact with the molding resin. Prevention of penetration of absorbed moisture and water can thus be enabled by means of high adhesion.

Further, in Embodiment 5, the entire peripheral portion 227 is formed as a plane portion. Therefore, the problem of a design margin between the bent portion 228 and the heat spreader 120 such as described above can be avoided even when an error in positioning of the heat spreader 120 occurs. An advantage in terms of the manufacturing process can thus be obtained.

The smaller-thickness portion 296 may be formed by performing chemical working (half etching) on the end portion of the metal sheet 24 (copper foil). The smaller-thickness portion 296 may be formed by performing mechanical working (shaving) on the end portion of the metal sheet 24 (copper foil).

Embodiment 6

A semiconductor device according to Embodiment 6 of the present invention will be described below. A semiconductor device according to Embodiment 6 and modified examples thereof described below have a common feature in having at least one of a projecting portion or a recess provided in the front surface of the peripheral portion of the sheet member.

Construction of Embodiment 6

Figure 25:
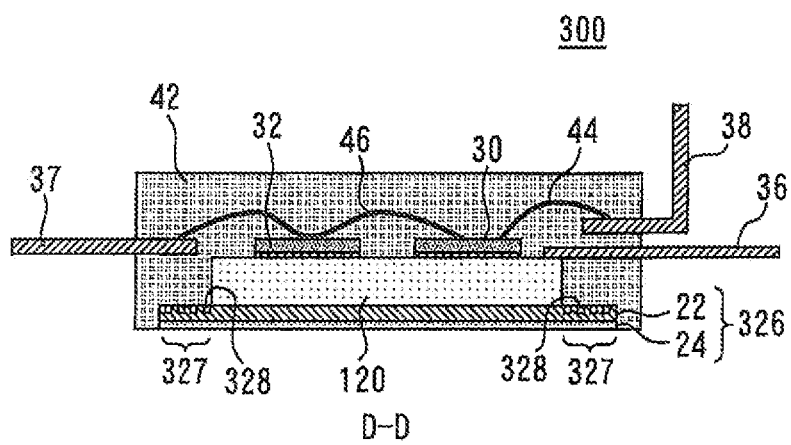
FIG. 25 is a sectional view of a semiconductor device according to Embodiment 6 of the present invention.
Figure 26:
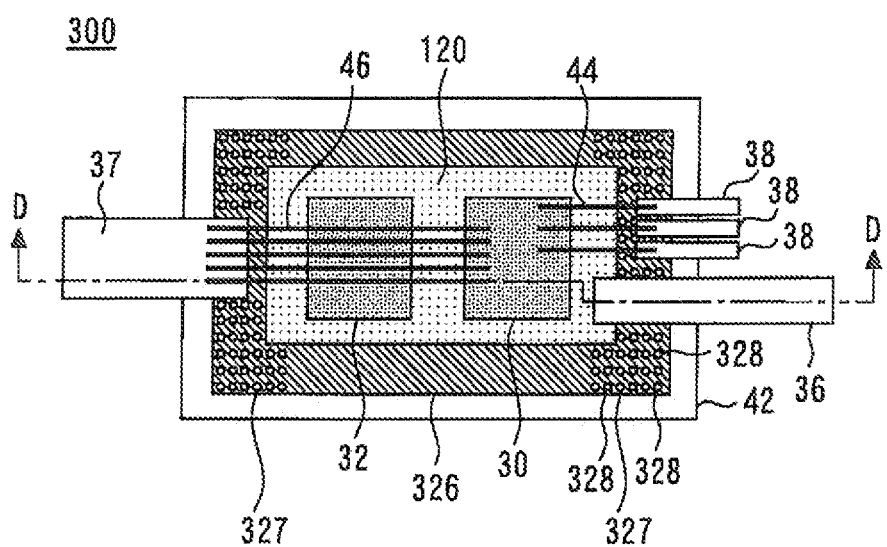
FIG. 26 is a plan view of the semiconductor device according to Embodiment 6 of the present invention.

FIG. 25 is a sectional view of a semiconductor device 300 according to Embodiment 6 of the present invention. FIG. 26 is a plan view of the semiconductor device 300 according to Embodiment 6 of the present invention. FIG. 25 shows a section of the semiconductor device 300 cut along line D-D in FIG. 26. FIG. 26 is a plan view of the semiconductor device 300 shown in FIG. 25, as seen in a top-to-bottom direction along the plane of FIG. 25. FIG. 26 shows the internal structure of the semiconductor device 300 through a molding resin in a see-through manner for convenience sake.

The semiconductor device 300 has the same construction as the semiconductor device 10 according to Embodiment 1 except for two points of difference described below. The first point of difference resides in having a sheet member 326 in place of the sheet member 26. The second point of difference resides in having a heat spreader 120 described in Embodiment 2 in place of the heat spreader 20.

The sheet member 326 differs from the sheet member 26 in having recesses 328. The sheet member 326 and the sheet member 26 have common features in other respects. That is, the sheet member 326 has the multilayer structure formed of the insulating sheet 22 and the metal sheet 24 and a peripheral portion 327 corresponding to the peripheral portion 27.

In Embodiment 6, as shown in FIG. 26, a plurality of recesses 328 are provided along the two shorter sides of the sheet member 326 so as to surround the heat spreader 120.

Figure 27A:
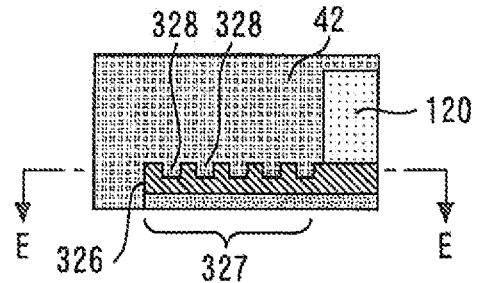
FIG. 27A is a partial sectional view schematically showing the vicinity of the peripheral portion according to Embodiment 6 of the present invention.
Figure 27B:
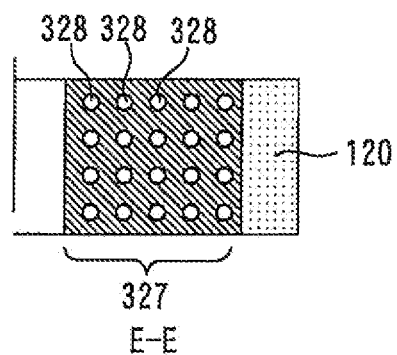
FIG. 27B is a sectional view taken along line E-E in FIG. 27A.

FIG. 27A is a partial sectional view schematically showing the vicinity of the peripheral portion according to Embodiment 6 of the present invention. FIG. 27B is a sectional view taken along line E-E in FIG. 27A. As illustrated, each recess 328 is circular, and the depth of each recess 328 reaches an intermediate position in the insulating sheet 22. The recesses 328 are provided from the end of the sheet member 326 to a position in the peripheral portion 327 close to the heat spreader 120.

The recesses 328 may be formed by sticking the insulating sheet 22 with movable pins. This working on the sheet is easy to perform and ensures a cost reduction effect.

Functions in Embodiment 6

In the semiconductor device 300 according to the present embodiment, a plurality of recesses 328 are provided in the surface of the peripheral portion 327 of the sheet member 326. The recesses 328 form a plurality of recessed portions. The moisture absorption distance (creeping distance) is increased by the plurality of recessed portions relative to that in a case where the sheet member 326 has only a flat surface.

Further, in the present embodiment, the molding resin enters the plurality of recesses 328 to increase the bonding area, thus enabling improving the adhesion in the interface between the peripheral portion 327 of the sheet member 326 and the molding resin 42 and limiting moisture absorption that may cause dielectric breakdown Inhibition of dielectric breakdown at the heat spreader 120 is thus enabled.

Modified Examples of Embodiment 6

Modified examples of Embodiment 6 will be described below with reference to the drawings. The figures referred to below show the internal structure of the semiconductor device 300 through the molding resin 42 in a see-through manner for convenience sake. In the figures, simplified illustrations of constructions are made. More specifically, illustrations of the constructions are simplified with respect to components other than the molding resin 42, the heat spreader 120 and the sheet member 326.

Modified Example 1

Figure 28A:
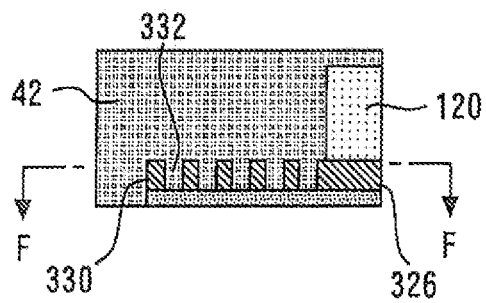
FIG. 28A includes schematic sectional views showing a modified example of the semiconductor device according to Embodiment 6 of the present invention.
Figure 28B:
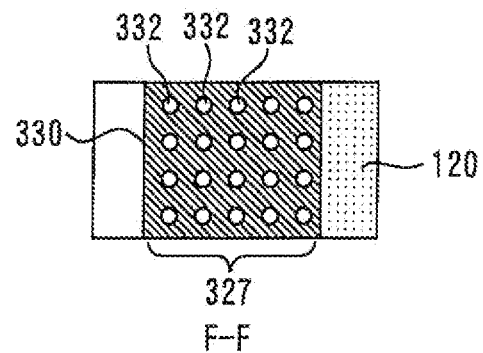
FIG. 28B is a sectional view taken along line F-F in FIG. 28A.

FIG. 28 includes schematic sectional views showing a modified example of the semiconductor device 300 according to Embodiment 6 of the present invention. FIG. 28A is a partial sectional view schematically showing the vicinity of the peripheral portion according to Embodiment 6 of the present invention. FIG. 28B is a sectional view taken along line F-F in FIG. 27A. In Modified Example 1, the same number of holes 332 are provided at the same positions as the recesses 328 according to Embodiment 6. The holes 332 differ from the recesses 328 in being formed through the insulating sheet 22 to expose the surface of the metal sheet 24. Bonding between the surface of the metal sheet 24 formed of copper foil and the molding resin 42 can thereby be achieved as well as the same effects as those of the recesses 328.

Also, the adhesion force between the metal sheet (copper foil in the present embodiment) and the molding resin is higher than the adhesion force between the metal sheet (copper foil in the present embodiment) and insulating layer (insulating sheet). Also, an anchoring effect can be produced by increasing the surface area of the metal sheet (copper foil in the present embodiment) to be brought into contact with the molding resin. Prevention of penetration of absorbed moisture and water can thus be enabled by means of high adhesion.

The holes 332 may be formed by sticking the insulating sheet 22 with movable pins. This working on the sheet is easy to perform and ensures a cost reduction effect.

Modified Example 2

Figure 29:
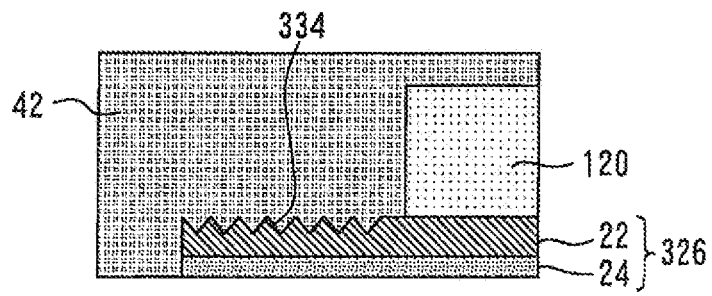
FIG. 29 is a schematic sectional view showing a modified example of the semiconductor device according to Embodiment 6 of the present invention.

FIG. 29 is a schematic sectional view showing a modified example of the semiconductor device 300 according to Embodiment 6 of the present invention. Referring to FIG. 29, a projection-recess portion 334 having triangular projections/recesses is provided in place of the recesses 328. The moisture absorption distance (creeping distance) is thereby increased relative to that in a case where the sheet member 326 has only a flat surface. The adhesion is also improved by an increase in the contact surface area at the interface with the molding resin 42, as in the case of the recesses 328.

Modified Example 3

Figure 30A:
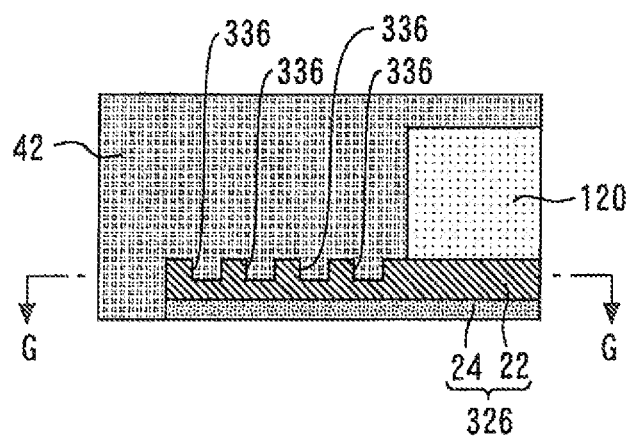
FIG. 30A is a schematic sectional view showing a modified example of the semiconductor device according to Embodiment 6 of the present invention.
Figure 30B:
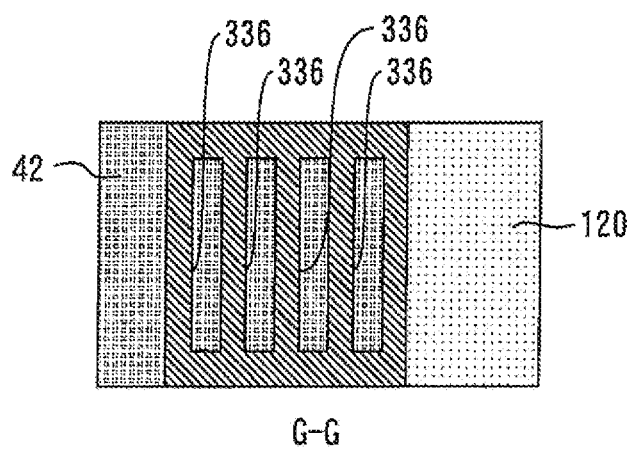
FIG. 30B is a sectional view taken along line G-G in FIG. 30A.

FIG. 30 includes schematic sectional views showing a modified example of the semiconductor device 300 according to Embodiment 6 of the present invention. FIG. 30A is a partial sectional view schematically showing the vicinity of the peripheral portion according to Embodiment 6 of the present invention. FIG. 30B is a sectional view taken along line G-G in FIG. 30A. Referring to FIG. 30, recesses 336 having rectangular recessed portions are provided in place of the recesses 328. The moisture absorption distance (creeping distance) is thereby increased relative to that in a case where the sheet member 326 has only a flat surface. The adhesion is also improved by an increase in the contact surface area at the interface with the molding resin 42, as in the case of the recesses 328.

The recesses rectangular (linear) as seen in plan as shown in FIG. 30B are not exclusively used. A plurality of (or a multiplicity of) recesses each of which is square as seen in plan may be arranged. The shape of the recesses as seen in plan is not necessarily a simple rectangular shape. The shape of the recesses may comprise various shapes including a L-shape, a U-shape and an annular shape as seen in plan.

Modified Example 4

Figure 31A:
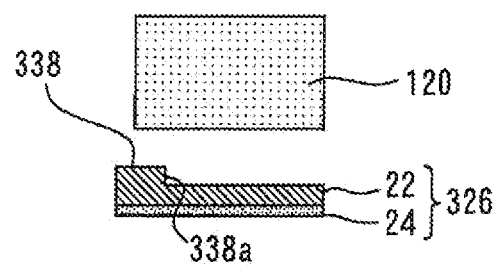
FIGS. 31A and 31B are schematic sectional view showing a modified example of the semiconductor device according to Embodiment 6 of the present invention.
Figure 31B:
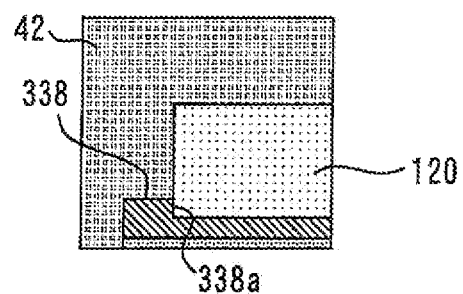

FIGS. 31A and 31B are schematic sectional views showing a modified example of the semiconductor device 300 according to Embodiment 6 of the present invention. In the modified example shown in FIG. 31, a larger-thickness portion 338 is provided on the sheet member 326. When the larger-thickness portion 338 exists, the moisture absorption distance (creeping distance) is increased by a value corresponding to the added thickness relative to that in the case where the thickness is uniform. Also, electric field concentration at the end portions of the heat spreader 120 (at the four corners in particular) can be moderated by increasing the insulating layer in thickness.

In the construction shown in FIG. 31, the heat spreader 120 is disposed so that its side surface contacts a side surface 338a of the larger-thickness portion 338. However, the present invention is not limited to this. The side surface 338a and the side surface of the heat spreader 120 may be spaced apart from each other. A space produced by this spacing is filled with the molding resin 42. A further increase in moisture absorption distance (creeping distance) can thereby be achieved.

Modified Example 5

In the present embodiment, a plurality of recesses 328 are provided along each of the two shorter sides of the sheet member 326. However, various modifications can be made as to in which positions in the sheet member 326 in the semiconductor device 300 as seen in plan the recesses 328 according to Embodiment 6 and the arrangements in Modified Examples 1 to 5 are provided.

For example, the same modifications as those in Embodiment 3 shown in FIG. 19 can also be made in Embodiment 6. For example, the recesses 328 or any of the arrangements in Modified Examples 1 to 5 may be provided on the peripheral portion 327 along all the four sides of the sheet member 326 in the same way as in the modified example shown in FIG. 19A. The recesses 328 or any of the arrangements in Modified Examples 1 to 5 may be locally provided at the four corners of the sheet member 326 in the same way as in the modified example shown in FIG. 19B. Alternatively, the recesses 328 or any of the arrangements in Modified Examples 1 to 5 may be provided on the peripheral portion 327 along the opposite two longer sides of the sheet member 326 in the same way as in the modified example shown in FIG. 19C.

Embodiment 7

Figure 32A:
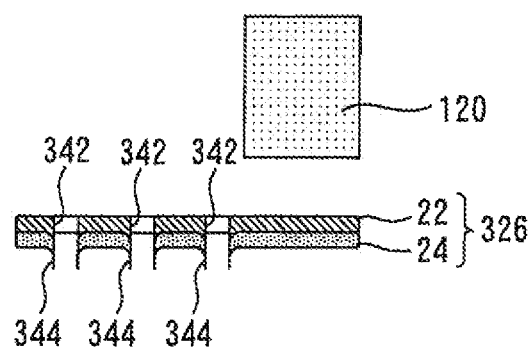
FIGS. 32A and 32B include schematic sectional views showing the construction of a semiconductor device according to Embodiment 7 of the present invention.
Figure 32B:
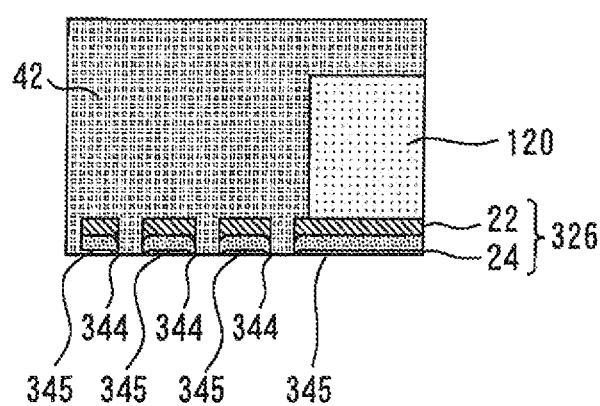

FIG. 32 includes schematic sectional views showing the construction of a semiconductor device 302 according to Embodiment 7 of the present invention. FIG. 32A is an enlarged sectional view of the vicinity of a peripheral portion showing a state before mounting the heat spreader 120 in the course of manufacturing of the semiconductor device 302. FIG. 32B is an enlarged sectional view of the vicinity of the peripheral portion of the semiconductor device 302 after molding resin encapsulation.

The semiconductor device 302 has the heat spreader 120, the sheet member 326, the IGBT 30 and the diode 32 as power semiconductor elements and the molding resin 42, as does the semiconductor device 200. The semiconductor device 302 also has the wires, the signal terminals and the main terminals, as does the semiconductor device 200. The construction is the same as that of the semiconductor device 200 according to Embodiment 3 as to components other than the molding resin 42, the heat spreader 120 and the sheet member 326. Therefore, illustration of them is omitted for ease of description.

In Embodiment 7, as shown in FIG. 32A, a plurality of through holes 342 are provided in the peripheral portion of the sheet member 326. Burrs 344 projecting on the back surface side are each provided on edge portions of the through holes 342. As shown in FIG. 32B, in the semiconductor device 302 in which molding resin encapsulation is performed, the molding resin 42 has burr covering portions 345 that cover the portions in the back surface of the peripheral portion where the burrs 344 are provided.

The moisture absorption distance (creeping distance) can be increased by covering the back surface of the sheet member 326 in this way. Also, the area of bonding between the metal sheet 24 formed of copper foil and the molding resin 42 can be increased by covering the burrs 344 with the burr covering portions 345 relative to that in the case where no burrs 344 are provided.

Embodiment 8

Construction of Embodiment 8

Figure 33:
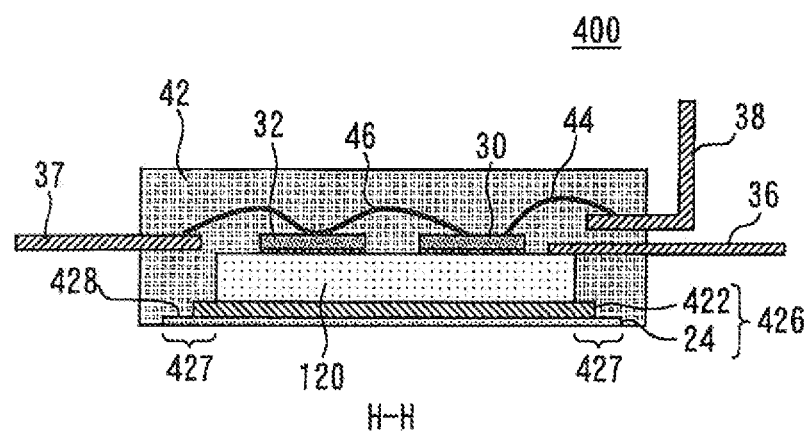
FIG. 33 is a sectional view of a semiconductor device according to Embodiment 8 of the present invention.
Figure 34:
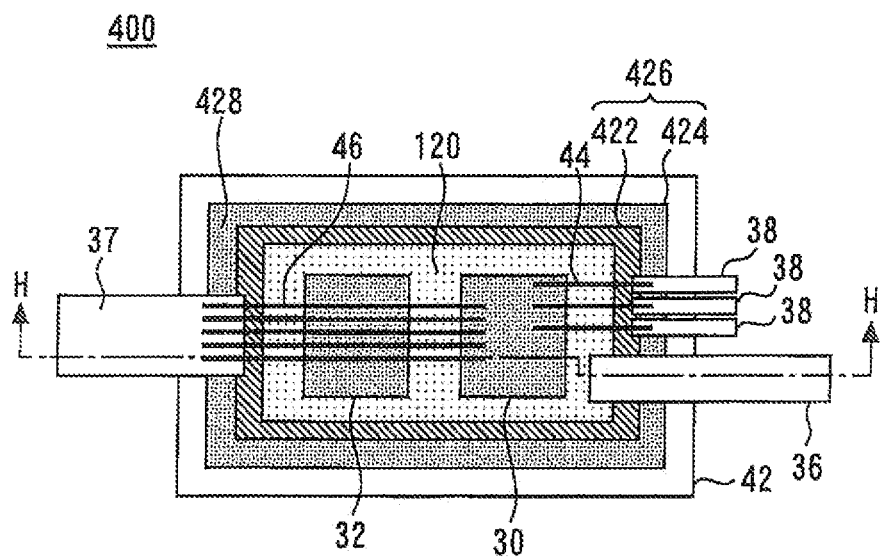
FIG. 34 is a plan view of the semiconductor device according to Embodiment 8 of the present invention.

FIG. 33 is a sectional view of a semiconductor device 400 according to Embodiment 8 of the present invention. FIG. 34 is a plan view of the semiconductor device 400 according to Embodiment 8 of the present invention. FIG. 33 shows a section of the semiconductor device 400 cut along line H-H in FIG. 34. FIG. 34 is a plan view of the semiconductor device 400 shown in FIG. 33, as seen in a top-to-bottom direction along the plane of FIG. 33. FIG. 34 shows the internal structure of the semiconductor device 400 through a molding resin in a see-through manner for convenience sake.

The semiconductor device 400 has the same construction as the semiconductor device 10 according to Embodiment 1 except for two points of difference described below. The first point of difference resides in having a sheet member 426 in place of the sheet member 26. The second point of difference resides in having the heat spreader 120 described in Embodiment 2 in place of the heat spreader 20.

Figure 35:
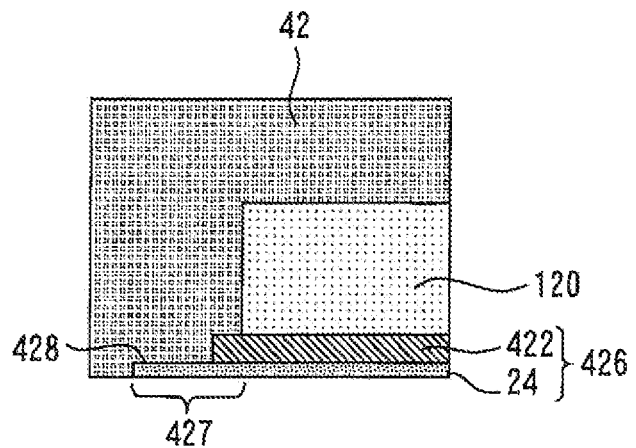
FIG. 35 is an enlarged sectional view of the vicinity of a peripheral portion of the semiconductor device according to Embodiment 8 of the present invention.

FIG. 35 is an enlarged sectional view of the vicinity of a peripheral portion of the semiconductor device 400 according to Embodiment 8 of the present invention. The sheet member 426 has a multilayer structure formed of an insulating sheet and a metal sheet and also has a peripheral portion 427, as does each of the sheet members 26, 226, and 326. In the sheet member 426, however, the metal sheet 24 has a size slightly larger than that of an insulating sheet 422 as seen in plan. That is, the external shape of the insulating sheet 422 is slightly smaller than that of the metal sheet 24, and the metal sheet 24 further has a peripheral portion 428 that juts out from edges of the insulating sheet. The molding resin 42 covers a front surface of the peripheral portion 428.

Functions in Embodiment 8

In the present embodiment, the adhesion in the interface between the peripheral portion 427 of the sheet member 426 and the molding resin 42 can be improved. That is, the adhesion force between the metal sheet (copper foil in the present embodiment) and the molding resin is higher than the adhesion force between the metal sheet (copper foil in the present embodiment) and insulating layer (insulating sheet). Also, an anchoring effect can be produced by increasing the surface area of the metal sheet (copper foil in the present embodiment) to be brought into contact with the molding resin. Prevention of penetration of absorbed moisture and water can thus be enabled by means of high adhesion. Moisture absorption that may cause dielectric breakdown can thereby be limited. Dielectric breakdown at the heat spreader 120 can thereby be inhibited.

Modified Examples of Embodiment 8

FIGS. 36 to 43 are schematic enlarged sectional views of the vicinity of the peripheral portion, showing modified examples of the semiconductor device 400 according to Embodiment 8 of the present invention.

Figure 36:
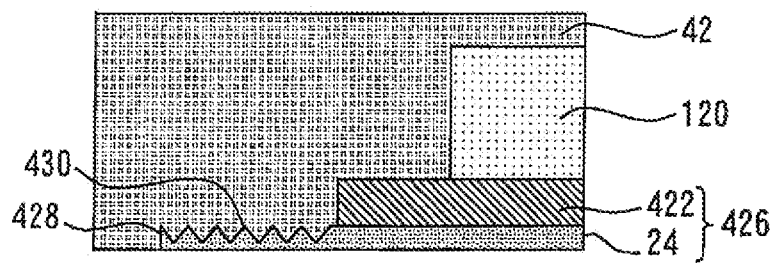
FIG. 36 is a schematic enlarged sectional view of the vicinity of the peripheral portion, showing modified examples of the semiconductor device according to Embodiment 8 of the present invention.

As shown in FIG. 36, a triangular projection-recess portion 430 may be provided in the peripheral portion 428.

Figure 37A:
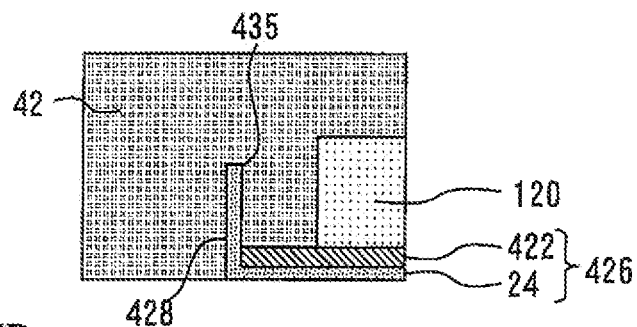
FIGS. 37A and 37B are schematic enlarged sectional views of the vicinity of the peripheral portion, showing modified examples of the semiconductor device according to Embodiment 8 of the present invention.
Figure 37B:
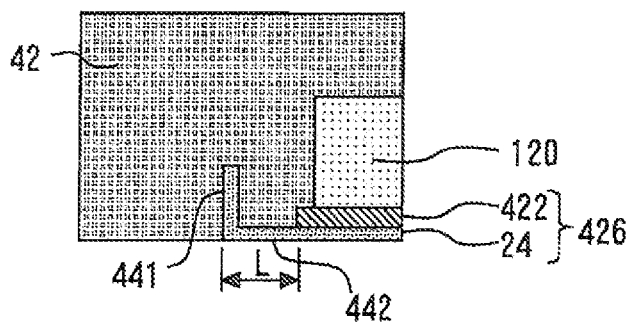
Figure 38A:
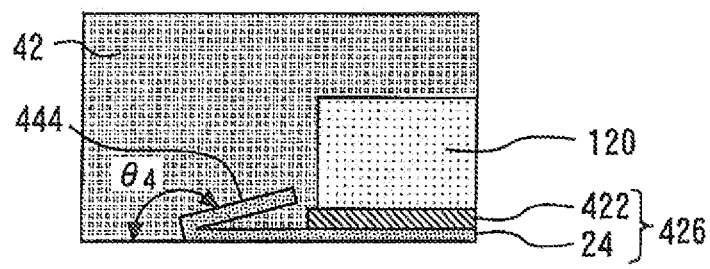
FIGS. 38A and 38B are schematic enlarged sectional views of the vicinity of the peripheral portion, showing modified examples of the semiconductor device according to Embodiment 8 of the present invention.
Figure 38B:
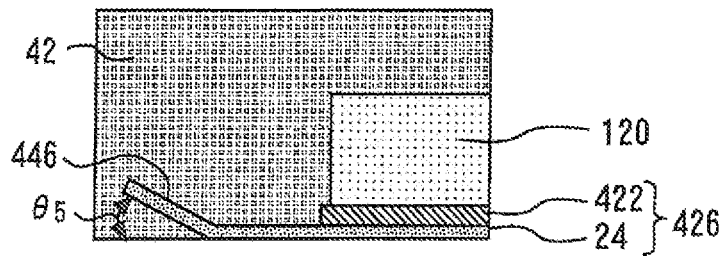

As shown in FIG. 37, a bent portion 435 may be provided by bending the peripheral portion 428. The entire peripheral portion 428 may be bent, as shown in FIG. 37A. As shown in FIG. 37B, a bent portion 441 and a plane portion 442 may be provided by bending the peripheral portion 428 at an intermediate position with a size L from the end portion of the insulating sheet 422. In this case, the dielectric withstand voltage can also be increased. As shown in FIG. 38, a bent portion 444 may be provided by bending through a predetermined obtuse angle of $\theta_4$, and a bent portion 446 may be provided by bending through a predetermined acute angle of $\theta_5$. Preferably, this bending angle is set within a range from 15 to 165 degrees. The molding resin 42 covers the front surface and the back surface of the metal sheet 24 in the case where bending is performed as shown in FIG. 37 or 38. The molding resin then bonds to both the front and back surfaces of the metal sheet (copper foil in the present embodiment), so that high adhesion can be achieved.

Figure 39A:
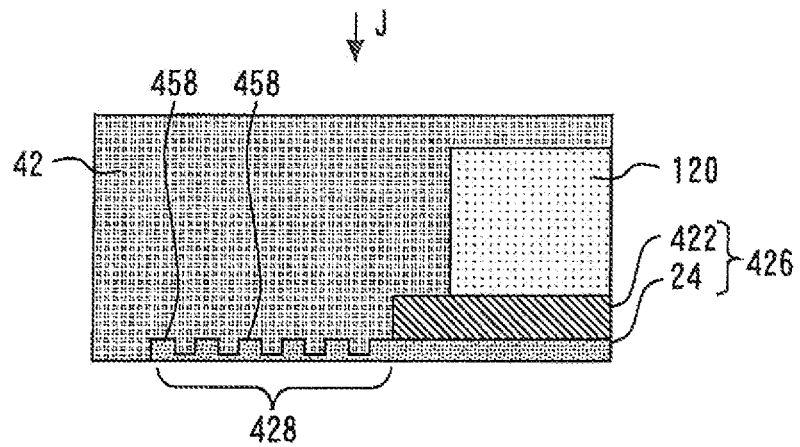
FIG. 39A is a schematic enlarged sectional view of the vicinity of the peripheral portion, showing modified examples of the semiconductor device according to Embodiment 8 of the present invention.
Figure 39B:
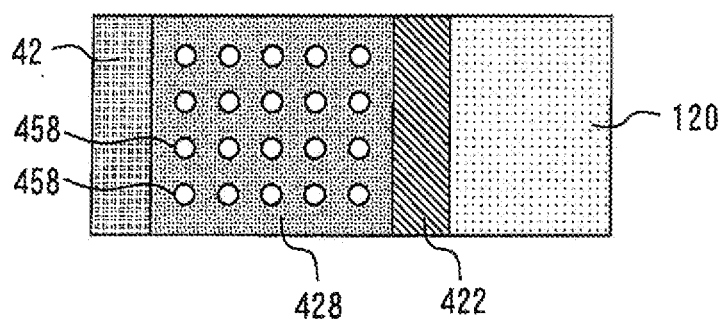
FIG. 39B is a plan view as viewed along arrow J in FIG. 39A.

As shown in FIG. 39, a plurality of recesses 458 may be provided in the peripheral portion 428. FIG. 39B is a plan view as viewed along arrow J in FIG. 39A, showing the internal portions through the molding resin 42 in a see-through manner for convenience sake.

Figure 40:
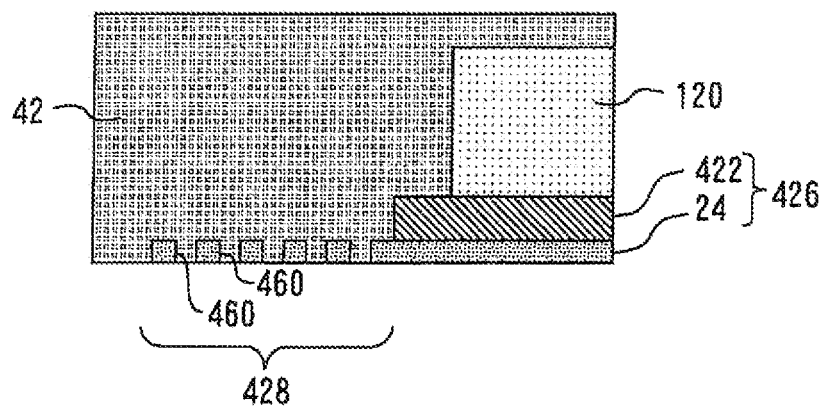
FIG. 40 is a schematic enlarged sectional view of the vicinity of the peripheral portion, showing modified examples of the semiconductor device according to Embodiment 8 of the present invention.

As shown in FIG. 40, a plurality of through holes 460 may be provided in the peripheral portion 428.

Figure 41A:
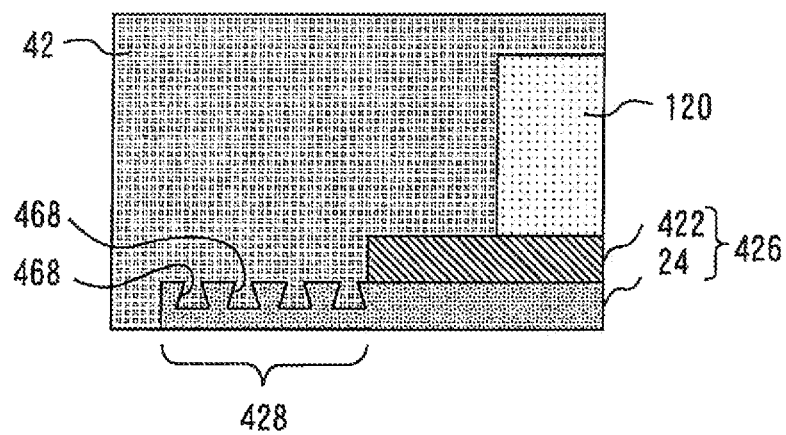
FIG. 41A is a schematic enlarged sectional view of the vicinity of the peripheral portion, showing modified examples of the semiconductor device according to Embodiment 8 of the present invention.
Figure 41B:
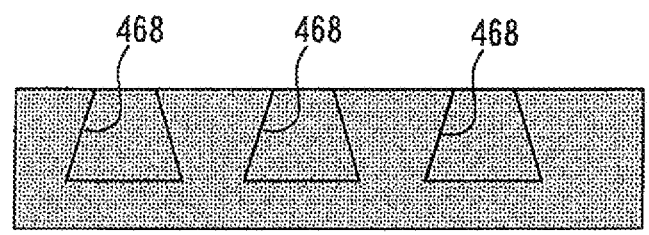
FIG. 41B is an enlarged sectional view of the vicinity of the recesses shown in FIG. 41A.
Figure 42A:
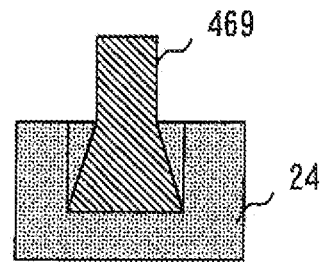
FIGS. 42A to 42E are diagrams showing an example of a method of making the recess shown in FIG. 41.
Figure 42B:
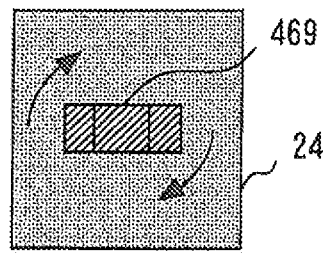
Figure 42C:
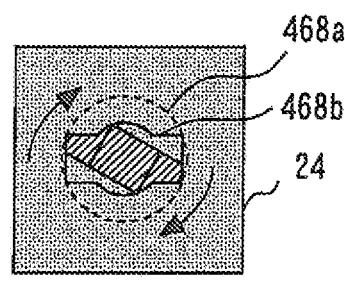
Figure 42D:
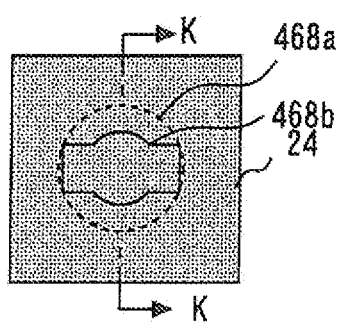
Figure 42E:
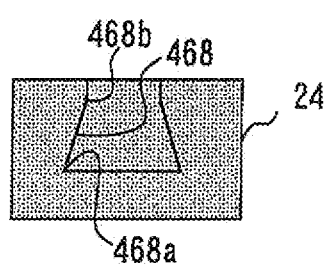

As shown in FIG. 41, trapezoidal recesses 468 may be provided in the peripheral portion 428. FIG. 41B is an enlarged sectional view of the vicinity of the recesses 468 shown in FIG. 41A. With the trapezoidal recesses 468, an effect of further increasing the moisture absorption distance and an effect of improving the area of bonding between the metal sheet and the molding resin can be obtained. Moreover, the molding resin 42 can penetrate into the recesses 468, thereby mechanically connecting the molding resin 42 and the metal sheet 24.

FIG. 42 is a diagram showing an example of a method of making the recess 468 shown in FIG. 41. A press tool tip 469 having a shape shown in a sectional view of FIG. 42A and a plan view of FIG. 42B is thrust into the metal sheet 24. Next, the press tool tip 469 is turned through 180 degrees or 360 degrees as indicated by arrows in FIG. 42B. The metal sheet 24 is scooped out by the turning. A bottom periphery 468a of the recess 468 indicated by a broken-line circle in a plan view of FIG. 42C and an inlet portion 468b are formed thereby. After successive turning through 180 degrees or 360 degrees, the press tool tip 469 is drawn out through the inlet portion 468b. As a result, the recess 468 is formed, as shown in a plan view of FIG. 42D and a sectional view of FIG. 42E (section taken along line K-K in FIG. 42D.

Figure 43A:
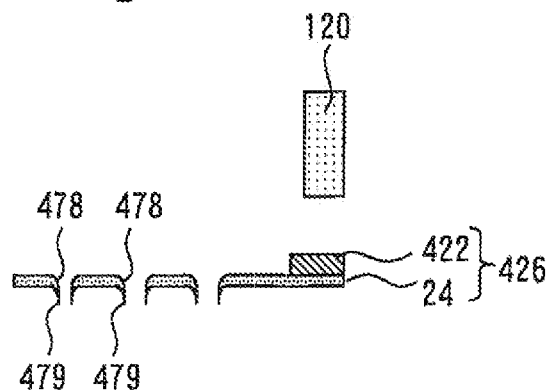
FIGS. 43A to 43C are schematic enlarged sectional views of the vicinity of the peripheral portion, showing modified examples of the semiconductor device according to Embodiment 8 of the present invention.
Figure 43B:
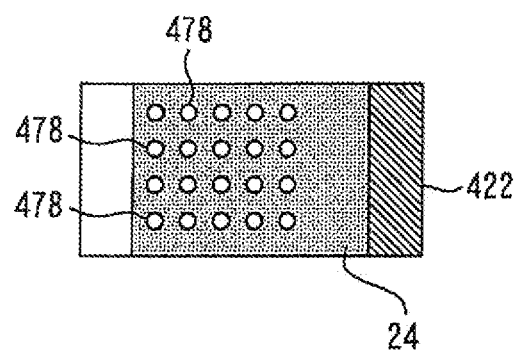
Figure 43C:
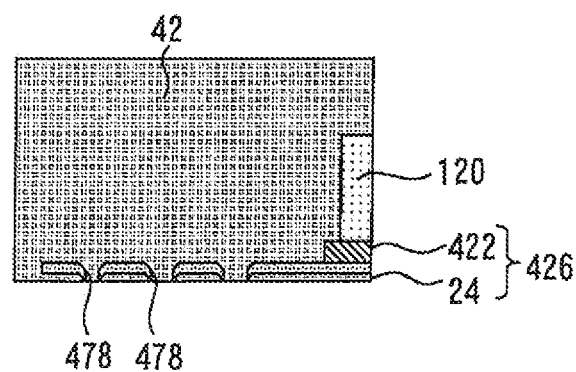

As shown in FIGS. 43A and 43B, a plurality of through holes 478 may be formed in the metal sheet 24 and burrs 479 are left on the edges of the through holes 478. This is based on the same technical concept as that in Embodiment 7. Thereafter, as shown in FIG. 43C, a burr covering portion that covers the portions in the back surface of the peripheral portion on which the burrs 479 are provided is provided in the molding resin 42 by resin encapsulation with the molding resin 42.

In the present embodiment, the peripheral portion 428 is provided at the four sides of the sheet member 426. However, various modifications can be made as to in which positions in the sheet member 426 in the semiconductor device 400 as seen in plan the peripheral portion 428 is provided. For example, also in Embodiment 8, the peripheral portion 428 may be provided along the opposite longer sides or shorter sides of the sheet member 426 or only at the four corners.

A suitable combination of any of the above-described embodiments may be used. Also, any of the coating layers, the bent portions, the holes, and so on in Embodiments 2 to 7 described above may be provided as desired in places corresponding to the two shorter sides, the two longer sides or the four corners of the sheet member as seen in plan.

In each of the above-described embodiments, an IGBT is used as a power semiconductor element. However, the present invention is not limited to this. A MOSFET may be used as a power semiconductor element in the present invention.

The heat spreader 20 according to Embodiment 1 may be used as any of the heat spreaders of the semiconductor devices in Embodiments 2 to 5. In each of the above-described embodiments, a semiconductor device in which only one set of an IGBT and a freewheel diode provided as power semiconductor elements is resin-encapsulated is disclosed. However, the present invention is not limited to this. The present invention can be applied even to a semiconductor device incorporating a plurality of sets of power semiconductor elements as an inverter circuit, for example. More specifically, the present invention can be applied, for example, to a semiconductor device having six sets of IGBTs and freewheel diodes as a three-phase inverter.

REFERENCE SIGNS LIST 10, 100, 200, 202, 300, 302, 400 semiconductor device
20, 120 heat spreader
21, 51 corner portion
22 insulating sheet
24 metal sheet
26, 140, 226, 326, 426 sheet member
27 peripheral portion
30 IGBT
32 diode
36, 37 main terminal
38 signal terminal
42 molding resin
44, 46 wire
122, 124, 126, 128, 130, 132 coating layer

The invention claimed is:

1. A semiconductor device comprising:
    a heat spreader including a bottom surface and being electrically conductive;
    a sheet member including a front surface and a back surface, the front and back surfaces electrically insulated from each other, the front surface contacting the bottom surface of the heat spreader, the sheet member including a peripheral portion that juts out from an edge of the bottom surface;
    a semiconductor element fixed on the heat spreader and electrically connected to the heat spreader; and
    an encapsulation resin body in which the front surface of the sheet member, the heat spreader, and the semiconductor element are encapsulated, and at least a portion of the back surface of the sheet member exposed from the encapsulation resin body;
    wherein the heat spreader includes a corner portion at a corner of the bottom surface, the corner portion includes a C-beveled shape as seen in the plan view, the corner portion is rectangular as seen in the section of the heat spreader.

2. A semiconductor device comprising:
    a heat spreader including a bottom surface and being electrically conductive;
    a sheet member including a front surface and a back surface, the front and back surfaces electrically insulated from each other, the front surface contacting the bottom surface of the heat spreader, the sheet member including a peripheral portion that juts out from an edge of the bottom surface;
    a semiconductor element fixed on the heat spreader and electrically connected to the heat spreader; and
    an encapsulation resin body in which the front surface of the sheet member, the heat spreader, and the semiconductor element are encapsulated, and at least a portion of the back surface of the sheet member exposed from the encapsulation resin body;
    wherein the front surface of the peripheral portion includes a layer formed of an electrically insulating coating material, the layer includes at least one of higher insulation quality electrical insulating property and higher adhesion to the front surface of the sheet member compared with a material of the encapsulation resin body.

3. The semiconductor device according to claim 2, wherein
    the electrically insulating coating material is a material selected from the group consisting of polyimide, polyamide and a polyfunctional epoxy polymer.

4. A method of manufacturing of a semiconductor device, the method comprising the steps of:
    preparing a heat spreader including a bottom surface and being electrically conductive, a semiconductor element to be fixed on the heat spreader, and a sheet member including a front surface and a back surface, the front and back surfaces electrically insulated from each other;

bending a peripheral portion of the sheet member to the heat spreader side by bent portion forming means, after placing the sheet member, the heat spreader and the semiconductor element fixed on the heat spreader into a cavity of a mold, placing the sheet member on a cavity bottom surface of the mold so that the back surface faces the cavity bottom surface, and placing the heat spreader on the front surface of the sheet member to provide the peripheral portion that juts out from an edge of the bottom surface of the heat spreader; and performing an encapsulating process, in a state where bending on the peripheral portion is completed, so that the front surface of the sheet member, the back surface of the peripheral portion, the heat spreader, and the semiconductor element are encapsulated, and at least a portion of the back surface of the sheet member is exposed.

5. The method of manufacturing of a semiconductor device according to claim 4, wherein the bent portion forming means is a projection provided for the back surface of an end portion of the sheet member.

6. The method of manufacturing of a semiconductor device according to claim 4, wherein the bent portion forming means is a pin provided in the cavity bottom surface in the mold and capable of projecting into the cavity.

7. The method of manufacturing of a semiconductor device according to claim 4, wherein the bent portion forming means is a projecting portion provided on the cavity bottom surface in the mold.

8. A semiconductor device comprising:
a heat spreader including a bottom surface and being electrically conductive;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the peripheral portion includes a smaller-thickness portion in the back surface, the smaller-thickness portion is a portion reduced in thickness to a tip of the peripheral portion so that a step is produced, and the step recesses the front surface side.

9. A semiconductor device comprising:
a heat spreader including a bottom surface and being electrically conductive;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the front surface of the peripheral portion includes at least one of a projecting portion extending from the front surface or a recess formed in the front surface.

10. The semiconductor device according to claim 9, wherein the at least one projecting portion includes a step projecting the front surface side compared with a central portion of the sheet member, and the step is provided at least in a vicinity of a corner of the bottom surface in the peripheral portion.

11. The semiconductor device according to claim 9, wherein the front surface of the peripheral portion includes a projection-recess portion having projection and recess so that the front surface of the peripheral portion has larger surface roughness than that of the front surface of a central portion of the sheet member,
the at least one projecting portion is the projection of the projection-recess portion, and
the at least one recess is the recess of the projection-recess portion.

12. The semiconductor device according to claim 9, wherein the at least one projecting portion includes an up-down form provided in the peripheral portion and projecting to a side of a surface contacting to the encapsulation resin body.

13. The semiconductor device according to claim 9, wherein the at least one recess includes a plurality of dimples formed on the peripheral portion.

14. A semiconductor device comprising:
a heat spreader including a bottom surface and being electrically conductive;
a sheet member including a front surface and a back surface, the front and back surfaces electrically insulated from each other, the front surface contacting the bottom surface of the heat spreader, the sheet member including a peripheral portion that juts out from an edge of the bottom surface;
a semiconductor element fixed on the heat spreader and electrically connected to the heat spreader; and
an encapsulation resin body in which the front surface of the sheet member, the heat spreader, and the semiconductor element are encapsulated, and at least a portion of the back surface of the sheet member exposed from the encapsulation resin body;
wherein the sheet member is formed by laying an insulating layer and a metal layer, the insulating layer provided the front surface side, the metal layer provided the back surface side compared with the insulating layer,
at least one through hole is provided in the peripheral portion, the through hole penetrates from the front surface to the back surface,
a bur projecting on the back surface side is provided on an edge portion of the through hole on the back surface side of the metal layer, and
the encapsulation resin body covers a portion in the back surface of the peripheral portion where the burr is provided.

15. A semiconductor device comprising:
a heat spreader including a bottom surface and being electrically conductive;
an insulating sheet including a front surface and a back surface, the front and back surfaces electrically insulated from each other, the front surface contacting the bottom surface of the heat spreader, a metal sheet contacting with the back surface of the insulating sheet, including a peripheral portion that juts out from an edge of the insulating sheet, the peripheral portion including an upper surface facing a region on the heat spreader side;

a semiconductor element fixed on the heat spreader and electrically connected to the heat spreader; and an encapsulation resin body in which the upper surface of the metal sheet, the heat spreader, and the semiconductor element are encapsulated, and at least a portion of the back surface of the metal sheet exposed from the encapsulation resin body.

16. The semiconductor device according to claim 15, wherein the peripheral portion of the metal sheet includes at least one of a projecting portion or a recess provided on the upper surface.

17. The semiconductor device according to claim 15, wherein the peripheral portion of the metal sheet includes a bent portion provided in a vicinity of a corner of the heat spreader or along a side of the heat spreader, the bent portion bending so as to rise on the upper surface side; and the encapsulation resin body covers a back surface of the metal sheet in the bent portion.

18. The semiconductor device according to claim 2, wherein the layer is composed of a material different from that of the sheet member.

19. The semiconductor device according to claim 2, wherein the layer is disposed so as to cover a portion of a side surface of the heat spreader.

20. The semiconductor device according to claim 2, wherein the layer is disposed overlapping, in a sectional view, with a side of the heat spreader.

* * * * *